US008183622B2

(12) United States Patent
Okanishi

(10) Patent No.: US 8,183,622 B2
(45) Date of Patent: May 22, 2012

(54) FLASH MEMORY DEVICE COMPRISING BIT-LINE CONTACT REGION WITH DUMMY LAYER BETWEEN ADJACENT CONTACT HOLES

(75) Inventor: Masatomi Okanishi, Fukushima-ken (JP)

(73) Assignee: Spansion LLC, Sunnyvale, CA (US)

( * ) Notice: Subject to any disclaimer, the term of this patent is extended or adjusted under 35 U.S.C. 154(b) by 1034 days.

(21) Appl. No.: 11/495,116

(22) Filed: Jul. 27, 2006

(65) Prior Publication Data
US 2007/0026604 A1    Feb. 1, 2007

Related U.S. Application Data

(63) Continuation-in-part of application No. PCT/JP2005/013763, filed on Jul. 27, 2005.

(51) Int. Cl.
*H01L 27/115* (2006.01)
*H01L 29/792* (2006.01)

(52) U.S. Cl. ........... 257/324; 257/E27.103; 257/E29.17; 257/E29.309

(58) Field of Classification Search .................. 257/324, 257/E21.679, E29.309, 314, 325, 326, 750, 257/752, 758, 760, E21.645, E21.662, E21.666, 257/E21.667, E21.68, E21.681, E21.682, 257/E21.69, E27.201, E27.103, E29.169, 257/E29.17, E29.039
See application file for complete search history.

(56) References Cited

U.S. PATENT DOCUMENTS 5,066,997 A * 11/1991 Sakurai et al. ............... 257/211
6,670,684 B2 * 12/2003 Ikeda .......................... 257/401

FOREIGN PATENT DOCUMENTS

| JP | 1107556 | 4/1989 |
| JP | 11297817 | 10/1999 |
| JP | 2002208643 | 7/2002 |
| JP | 2003133442 | 5/2003 |
| JP | 2003273252 | 9/2003 |
| JP | 2004193178 | 7/2004 |

* cited by examiner

*Primary Examiner* — Samuel Gebremariam
*Assistant Examiner* — Andrew O. Arena

(57) ABSTRACT

A semiconductor device includes bit lines (12) that are provided in a semiconductor substrate (10) an ONO film (14) that is provided on the semiconductor substrate; word lines that are provided on the ONO film (14) and extend in a width direction of the bit lines (12); and a dummy layer (44) that extends in the width direction of the bit lines (12) and is provided in a bit-line contact region (40) having contact holes formed to connect the bit lines (12) with wiring layers (34). In accordance with the present invention, the proximity effect at the time of word line formation can be restrained, and the variation in the widths of the word lines can be made smaller, or current leakage between the bit lines and the semiconductor substrate can be restrained.

18 Claims, 18 Drawing Sheets

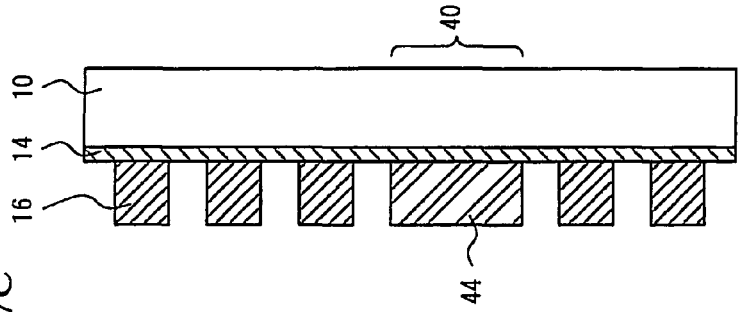
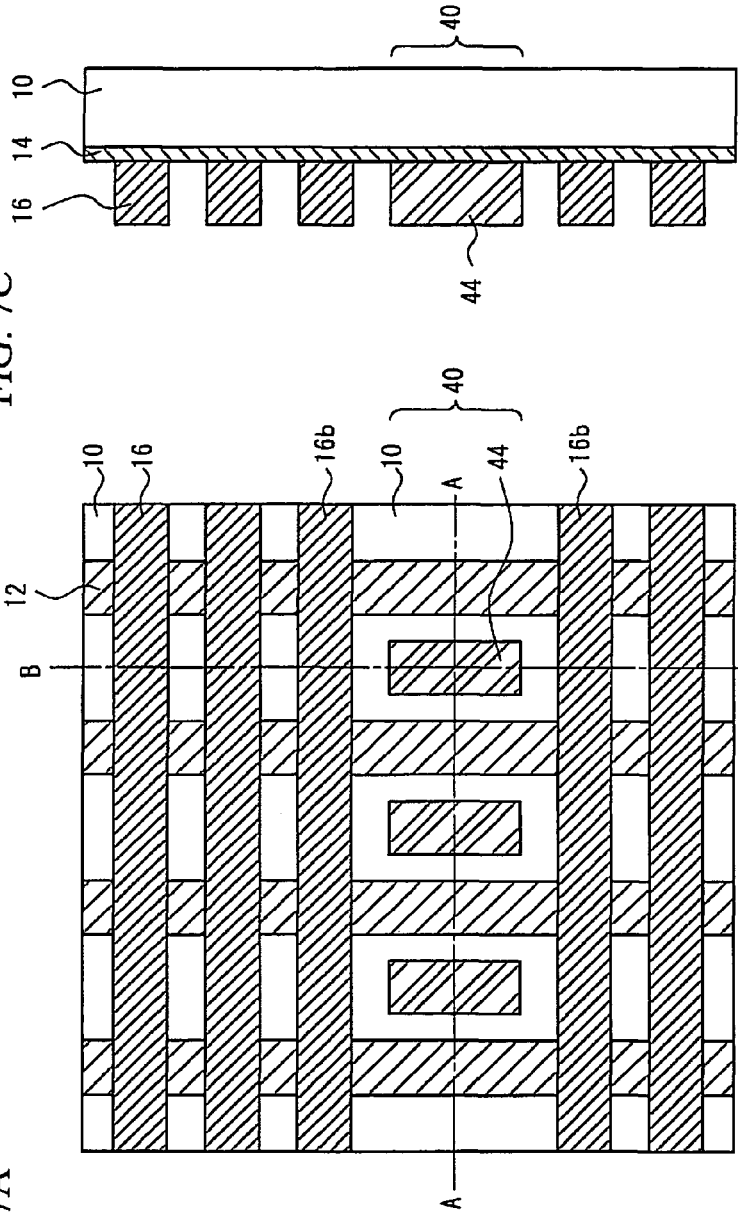
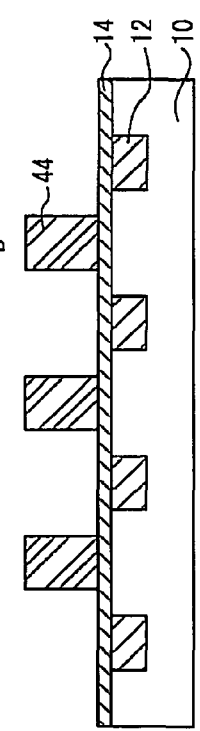

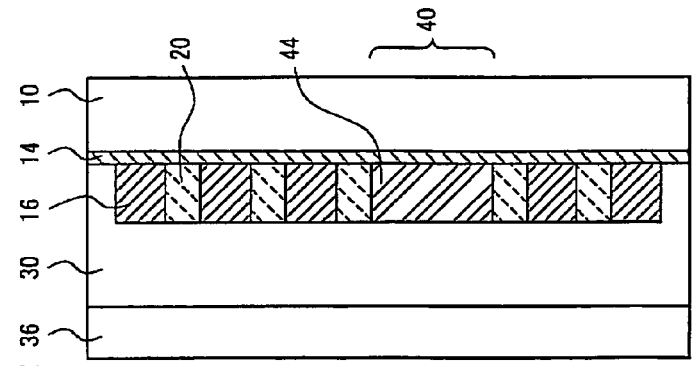
FIG. 10C
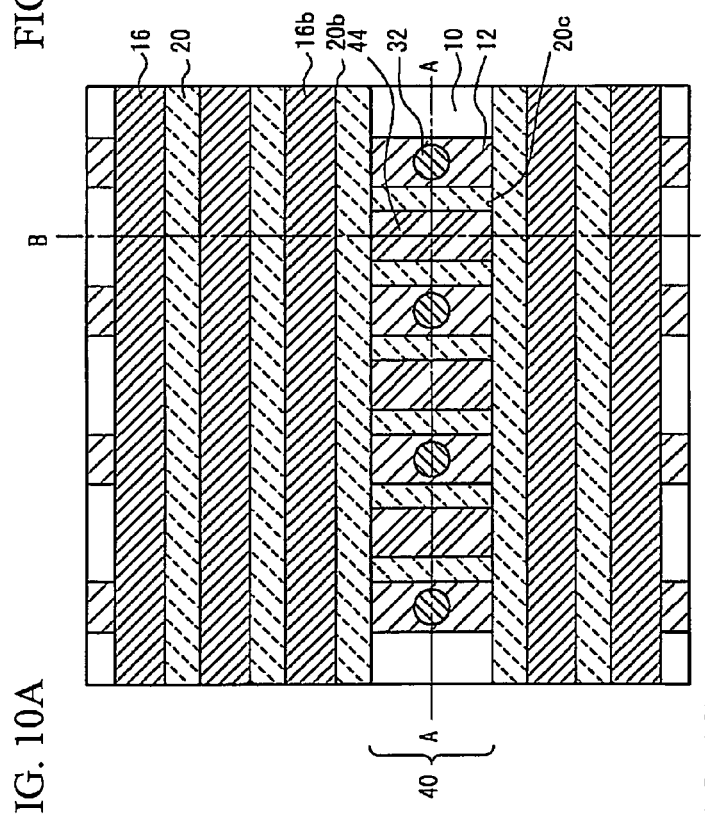
FIG. 10A
FIG. 10B

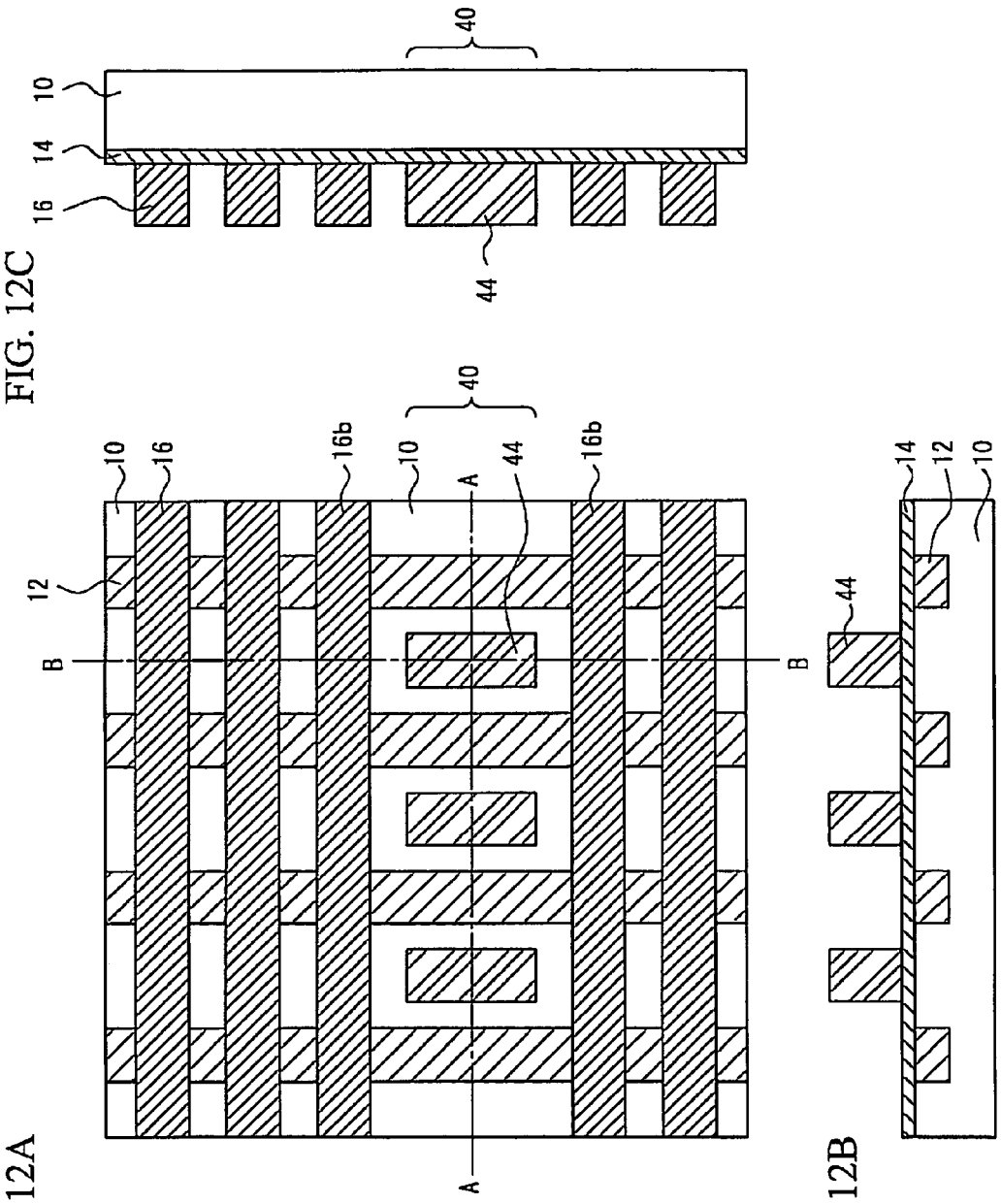

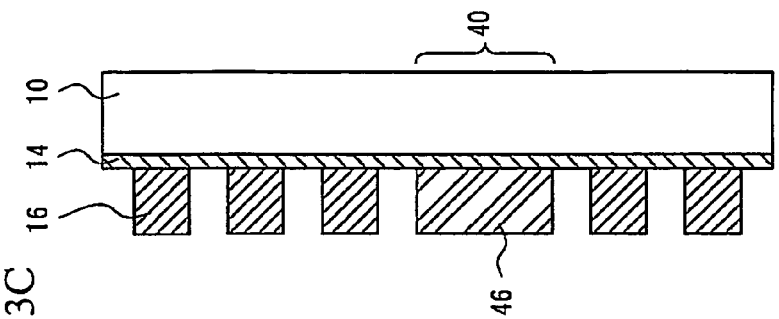
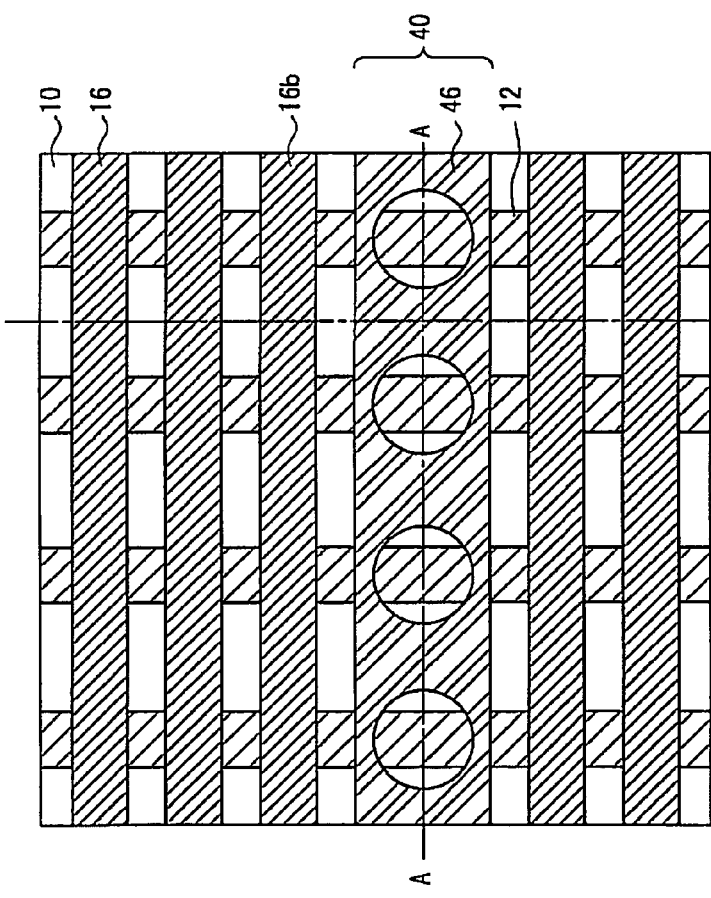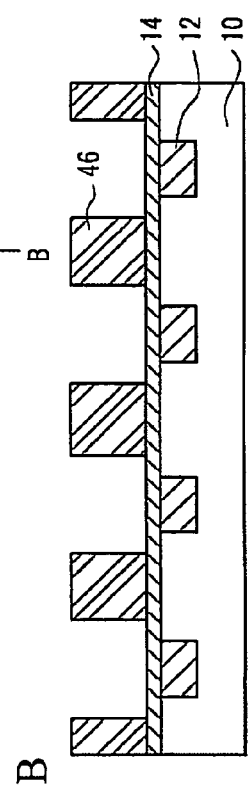
FIG. 13A
FIG. 13B
FIG. 13C

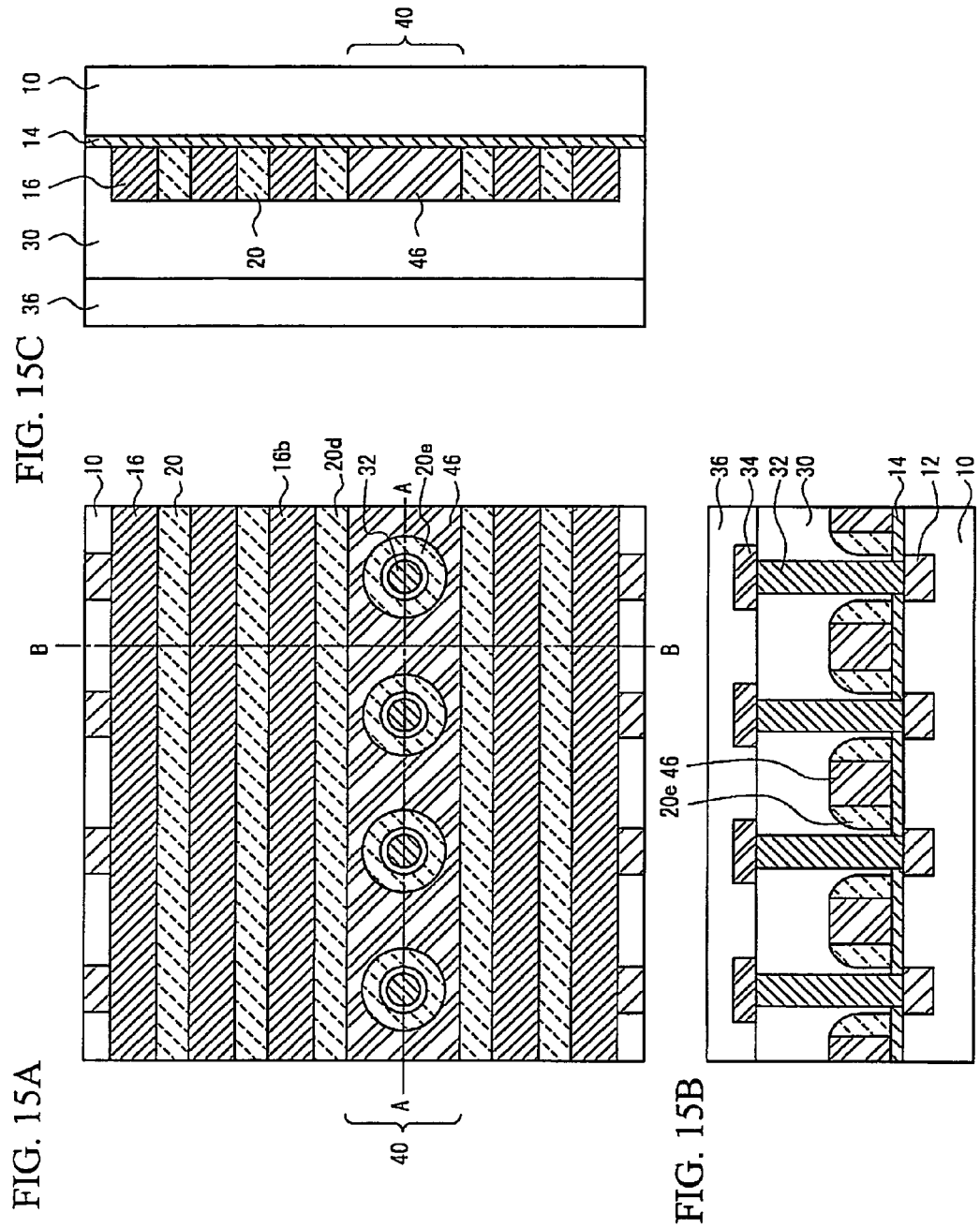

FLASH MEMORY DEVICE COMPRISING BIT-LINE CONTACT REGION WITH DUMMY LAYER BETWEEN ADJACENT CONTACT HOLES

CROSS-REFERENCES TO RELATED APPLICATIONS

This is a continuation in part of International Application No. PCT/JP2005/013763, filed Jul. 27, 2005 which was not published in English under PCT Article 21(2).

TECHNICAL FIELD

The present invention generally relates to a semiconductor device and a method of fabricating the semiconductor device, and more particularly, to a semiconductor device having non-volatile memories and a method of fabricating the semiconductor device.

BACKGROUND OF THE INVENTION

Description of the Related Art

In recent years, non-volatile memories that are data rewritable semiconductor devices are widely used. In the field of non-volatile memory, studies and developments of smaller memory cells are being made to achieve larger memory capacities. Non-volatile memories include flash memories having such structures as a MONOS (Metal Oxide Nitride Oxide Silicon) structure and a SONOS (Silicon Oxide Nitride Oxide Silicon) structure having charges accumulated in an ONO (Oxide/Nitride/Oxide) film. Among those flash memories, there is a flash memory having bit lines that are embedded in the semiconductor substrate and serve as a source region and a drain region for purpose of miniaturization of memory cells (see U.S. Pat. No. 6,011,725).

Referring to prior art FIGS. 1A (prior art) through 3C (prior art), a conventional flash memory is described. In FIGS. 1A (prior art), 2A (prior art), and 3A (prior art), the ONO film 14, the interlayer insulating film 30, the wiring layers 34, and the protection film 36 are not shown. As shown in prior art FIGS. 1A (prior art) through 1C (prior art), ion implantation is performed to form n-type bit lines 12 in a p-type silicon semiconductor substrate 10. The bit lines 12 extend in the direction of B-B shown in FIG. 1A (prior art). An ONO film 14 is formed on the semiconductor substrate 10, and word lines 16 are formed on the ONO film 14. The formation of the word lines 16 is carried out by forming a polycrystalline silicon film on the entire surface, followed by conventional exposure or etching. A bit-line contact region 40 that will be described later is provided for every several word lines 16.

Referring now to prior art FIGS. 2A (prior art) through 2C (prior art), sidewall layers 20 formed from silicon nitride film are formed on both sides of each of the word lines 16. The portions between the word lines 16 are filled with the sidewall layers 20. As shown in prior art FIGS. 2A (prior art) and 2C (prior art), the bit-line contact region 40 is not filled with the sidewall layers 20, but sidewall layers 20a are formed at side portions of the word lines 16a on both sides of the bit-line contact region 40.

Referring now to prior art FIGS. 3A (prior art) through 3C (prior art), an interlayer insulating film 30 is formed over the word lines 16, the sidewall layers 20, and the ONO film 14. Contact holes 32 connecting to the bit lines 12 in the bit-line contact region 40 are formed in the interlayer insulating film 30 and the ONO film 14. The contact holes 32 are filled with plug metal. Wiring layers 34 that extend in the longitudinal direction of the bit lines 12 and connect to the bit lines 12 via the contact holes 32 are formed on the interlayer insulating film 30. A protection film 36 is formed over the wiring layers 34 and the interlayer insulating film 30. Thus, the conventional memory is completed.

In this flash memory, the bit lines 12 are formed from a diffusion layer through ion implantation. Therefore, the bit lines 12 have higher resistance than the metal material of the wiring layers 34 or the like. As a result, only with the bit lines 12, the writing and erasing performances in the memory cells deteriorate. To counter this problem, at intervals of several word lines 16, the wiring layers 34 made of a metal having lower resistance than the bit lines 12 are connected to the bit lines 12 via the contact holes 32. With this arrangement, degradation of the writing and erasing performances is restrained. To reduce the area of the memory cell region, the bit-line contact region 40 extending in the longitudinal direction of the word lines 16 is provided for every several word lines 16, and the contact holes 32 are formed in the bit-line contact region 40.

There are the following problems with the conventional art. First, as shown in FIG. 3A (prior art), when the word lines 16 are formed, the width WL2 of each of the word lines 16a on both sides of the bit-line contact region 40 is larger than the width WL1 of each of the word lines 16 neighboring one another. For example, in a case where WL1 is 150 nm, WL2 is 170 nm. This is due to a proximity effect caused by the exposure of the resist pattern of the word lines 16. In this structure, the variation in the widths of the word lines 16 is large. Since the word lines 16 also serve as the control gate, the variation in the electric characteristics of the memory cells becomes larger as the variation in the widths of the word lines 16 becomes larger due to the proximity effect.

While each of the sidewall layers 20 has its sides both in contact with the word lines 16, each of the sidewall layers 20a facing the bit-line contact region 40 only has one side in contact with each corresponding word line 16a. Because of this, each of the sidewall layers 20 between the word lines 16 has a different cross section from the cross section of each of the sidewall layers 20a facing the bit-line contact region 40. Also, the width SW1 of each of the sidewall layers 20 between the word lines 16 is different from the width SW2 of each of the sidewall layers 20a facing the bit-line contact region 40. For example, in a case where SW1 is 80 nm, SW2 is 90 nm. In this structure, variations in the widths and shapes of the sidewall layers 20 are large. The sidewall layers 20 are made of insulating film such as silicon nitride film having high stress. With this arrangement, the stress applied from the sidewall layers 20 to the memory cells on both sides of the bit-line contact region 40 differs from the stress applied to the other memory cells. As a result, the variation in the electric characteristics of the memory cells becomes large.

If there is misalignment of exposure in forming the contact holes 32 with respect to the bit lines 12, the contact holes 32 are formed directly on the semiconductor substrate 10. If this happens, junction current flows between the semiconductor substrate 10 and the plug metal in the contact holes 32. As a result, current leakage is caused between the semiconductor substrate and the bit lines 12.

SUMMARY OF THE INVENTION

The present invention has been made to overcome the above drawbacks of the prior art and has an object of providing a semiconductor device that can restrain a variation in the widths of the word lines, restrain variations in the widths and shapes of the sidewall layers, and restrain current leakage between the bit lines and the semiconductor substrate. The present invention is also to provide a method of manufacturing the semiconductor device.

According to a first aspect of the present invention, there is preferably provided a semiconductor device including: bit lines that are provided in a semiconductor substrate; an ONO film that is provided on the semiconductor substrate; word lines that are provided on the ONO film and extend in a width direction of the bit lines; and a dummy layer that extends in the width direction of the bit lines and is provided in a bit-line contact region having contact holes formed to connect the bit lines with wiring layers. In accordance with the present invention, the proximity effect at the time of word line formation can be restrained, and the variation in the widths of the word lines can be made smaller. According to a second aspect of the present invention, there is preferably provided a semiconductor device According to a second aspect of the present invention, there is preferably a method of fabricating a semiconductor device, comprising the steps of: forming bit lines in a semiconductor substrate; forming an ONO film on the semiconductor substrate; forming word lines on the ONO film, the word lines extending in a width direction of the bit lines; and forming a dummy layer on the ONO film in a bit-line contact region having contact holes to be formed to connect the bit lines with wiring layers, the dummy layer extending in the width direction of the bit lines. In accordance with the present invention, the proximity effect at the time of word line formation can be restrained, and the variation in the widths of the word lines can be made smaller.

BRIEF DESCRIPTION OF THE DRAWINGS

FIG. 7A is a top view illustrating a fourth procedure for manufacturing the flash memory in accordance with the first embodiment;

FIG. 7B is a cross-sectional view of the flash memory, taken along the line A-A of FIG. 7A;

FIG. 7C is a cross-sectional view of the flash memory, taken along the line B-B of FIG. 7A;

FIG. 10A is a top view illustrating a seventh procedure for manufacturing the flash memory in accordance with the first embodiment;

FIG. 10B is a cross-sectional view of the flash memory, taken along the line A-A of FIG. 10A;

FIG. 10C is a cross-sectional view of the flash memory, taken along the line B-B of FIG. 10A;

FIG. 12A is a top view illustrating a procedure for manufacturing a flash memory in accordance with a second embodiment of the present invention;

FIG. 12B is a cross-sectional view of the flash memory, taken along the line A-A of FIG. 12A;

FIG. 12C is a cross-sectional view of the flash memory, taken along the line B-B of FIG. 12A;

FIG. 13A is a top view illustrating a procedure for manufacturing a flash memory in accordance with a third embodiment of the present invention;

FIG. 13B is a cross-sectional view of the flash memory, taken along the line A-A of FIG. 13A;

FIG. 13C is a cross-sectional view of the flash memory, taken along the line B-B of FIG. 13A;

FIG. 15A is a top view illustrating yet another procedure for manufacturing the flash memory in accordance with the third embodiment;

FIG. 15B is a cross-sectional view of the flash memory, taken along the line A-A of FIG. 15A; and FIG. 15C is a cross-sectional view of the flash memory, taken along the line B-B of FIG. 15A.

DESCRIPTION OF THE PREFERRED EMBODIMENTS

A description will now be given, with reference to the accompanying drawings, of embodiments of the present invention.

First Embodiment

Referring to FIGS. 4A through 10C, a method of manufacturing a flash memory in accordance with a first embodiment is described. In FIGS. 4A, 5A, 6A, 7A, 8A, 9A, and 10A, the ONO film 14, the interlayer insulating film 30, the wiring layers 34, and the protection film 36 are not shown.

Figure 1C:
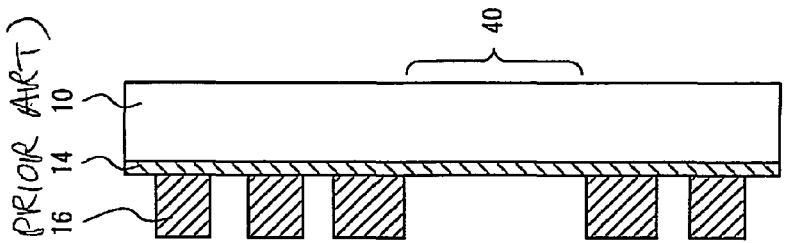
FIG. 1C (Prior Art) is a cross-sectional view of the flash memory, taken along the line B-B of FIG. 1A.
Figure 1A:
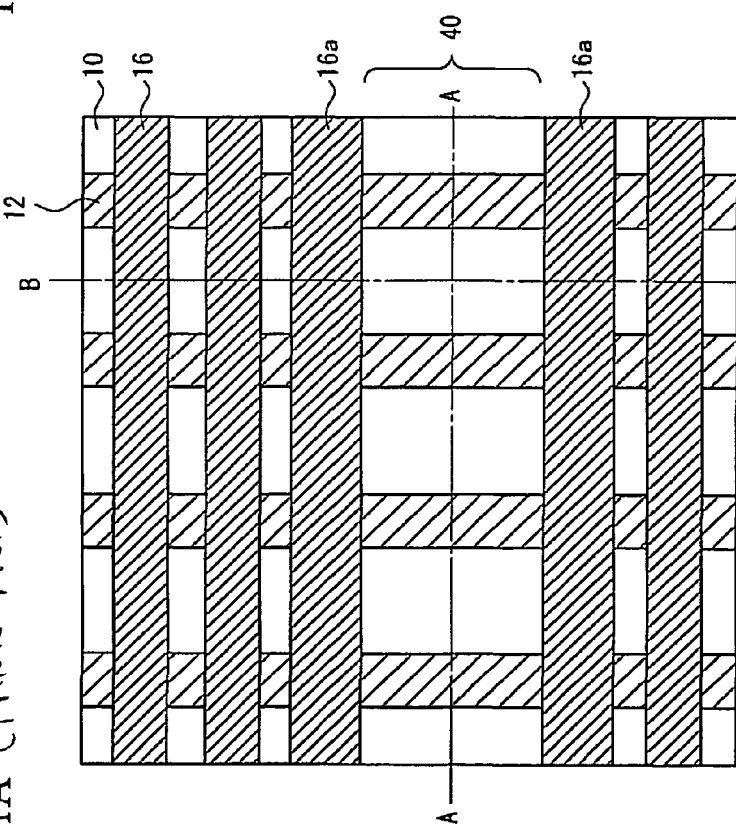
FIG. 1A (Prior Art) is a top view illustrating a first procedure for manufacturing a conventional flash memory.
Figure 1B:
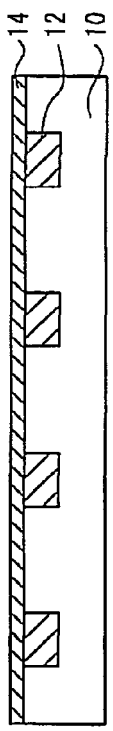
FIG. 1B (Prior Art) is a cross-sectional view of the flash memory, taken along the line A-A of FIG. 1A.
Figure 2C:
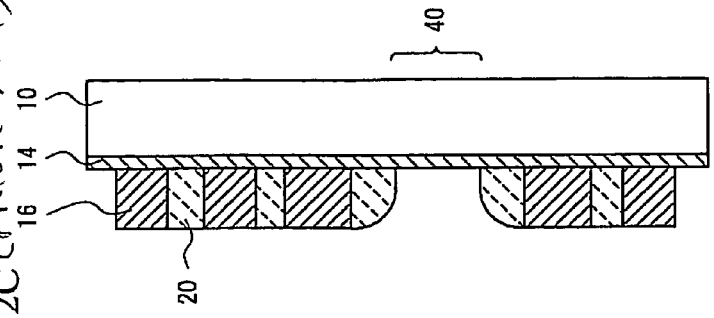
FIG. 2C (Prior Art) is a cross-sectional view of the flash memory, taken along the line B-B of FIG. 2A.
Figure 2A:
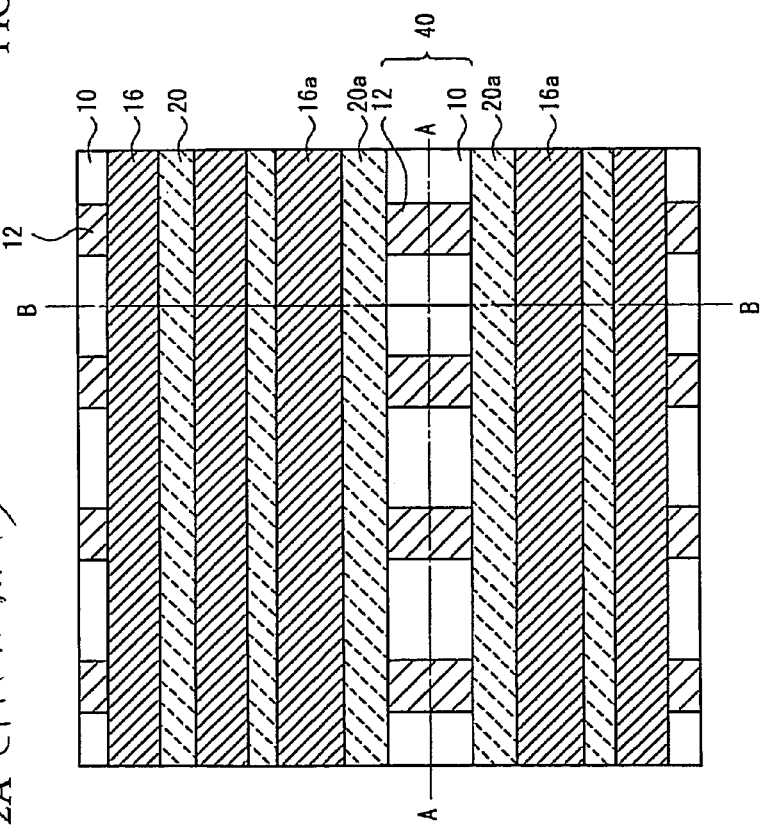
FIG. 2A (Prior Art) is a top view illustrating a second procedure for manufacturing the conventional flash memory.
Figure 2B:
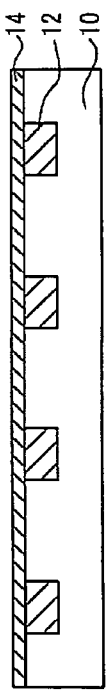
FIG. 2B (Prior Art) is a cross-sectional view of the flash memory, taken along the line A-A of FIG. 2A.
Figure 3C:
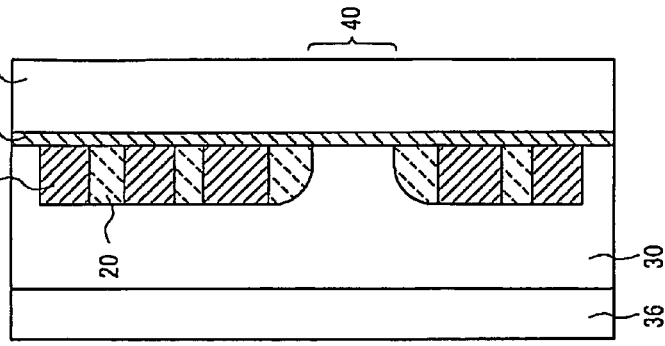
FIG. 3C (Prior Art) is a cross-sectional view of the flash memory, taken along the line B-B of FIG. 3A.
Figure 3A:
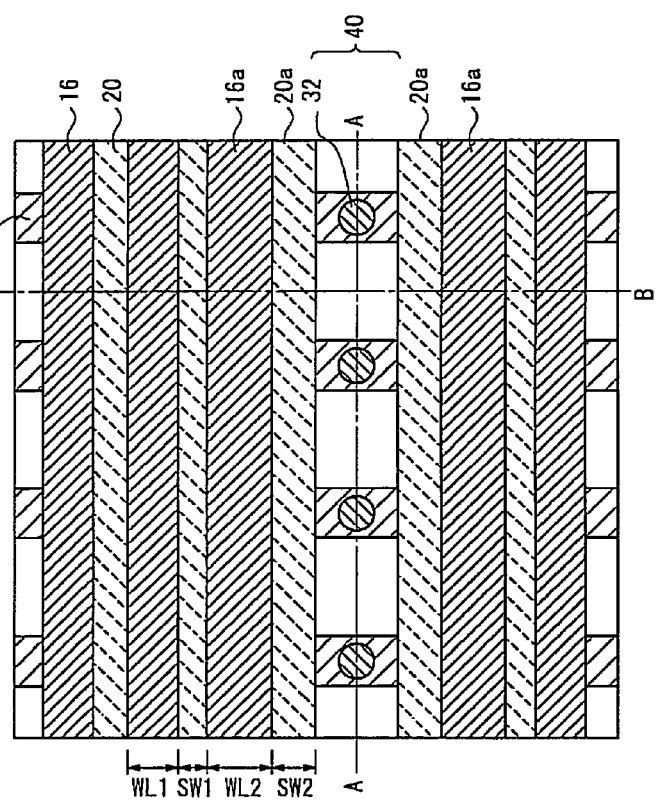
FIG. 3A (Prior Art) is a top view illustrating a third procedure for manufacturing the conventional flash memory.
Figure 3B:
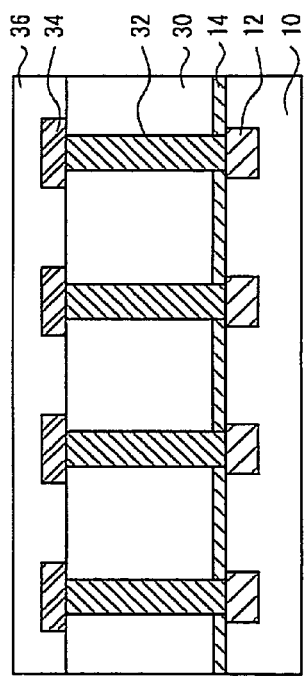
FIG. 3B (Prior Art) is a cross-sectional view of the flash memory, taken along the line A-A of FIG. 3A.
Figure 4C:
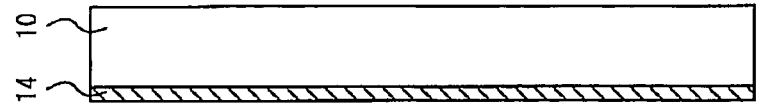
FIG. 4C is a cross-sectional view of the flash memory, taken along the line B-B of FIG. 4A.
Figure 4A:
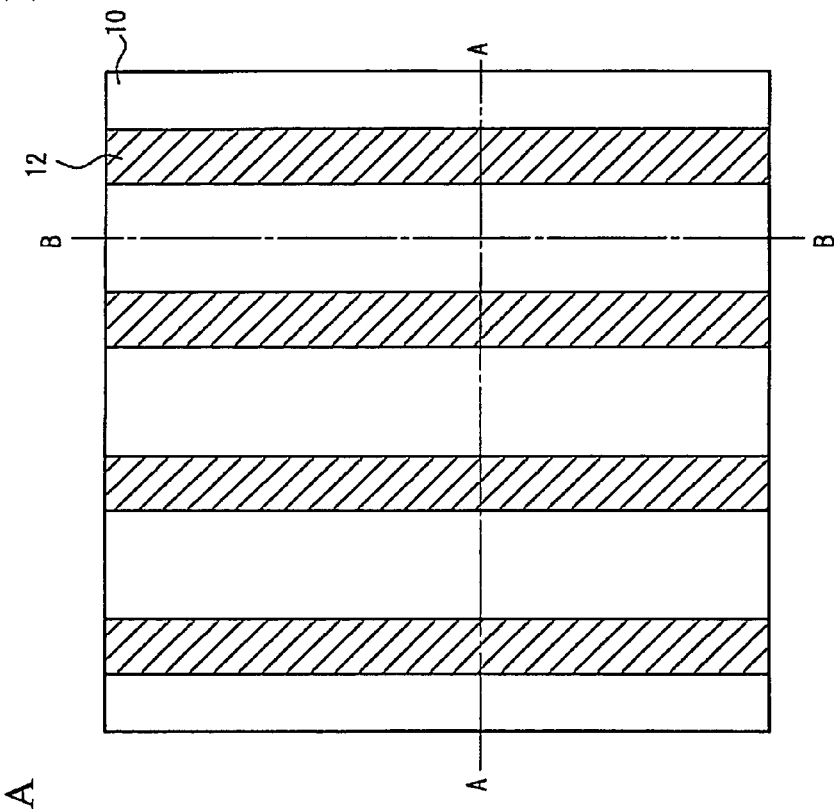
FIG. 4A is a top view illustrating a first procedure for manufacturing a flash memory in accordance with a first embodiment of the present invention.
Figure 4B:
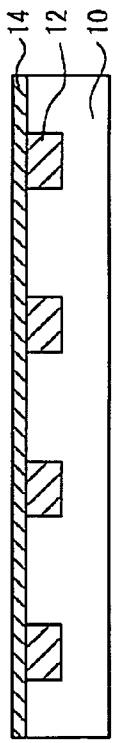
FIG. 4B is a cross-sectional view of the flash memory, taken along the line A-A of FIG. 4A.

Referring first to FIGS. 4A through 4C, arsenic ions are injected into a p-type silicon semiconductor substrate 10 (or a p-type region in a semiconductor substrate), so as to form bit lines 12. The bit lines 12 extend in the B-B direction shown in FIG. 4A. The ONO film 14 is formed on the semiconductor substrate 10 in the following manner. A silicon oxide film is first formed as a tunnel oxide film by a thermal oxidization technique or the like, a silicon nitride film is next formed as a trap layer by CVD or the like, and a silicon nitride film is then formed as a top oxide film by CVD or the like.

Figure 5C:
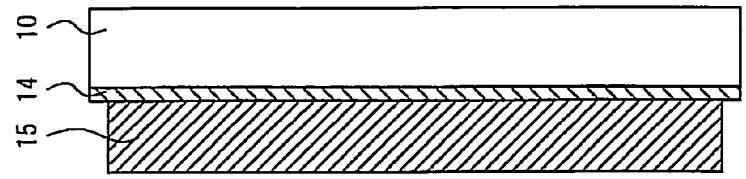
FIG. 5C is a cross-sectional view of the flash memory, taken along the line B-B of FIG. 5A.
Figure 5A:
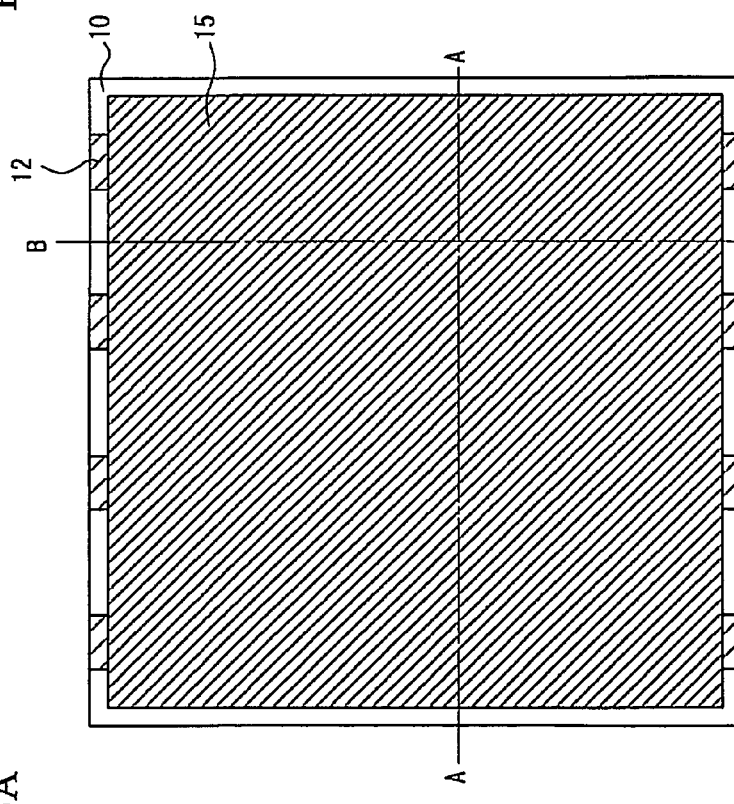
FIG. 5A is a top view illustrating a second procedure for manufacturing the flash memory in accordance with the first embodiment.
Figure 5B:
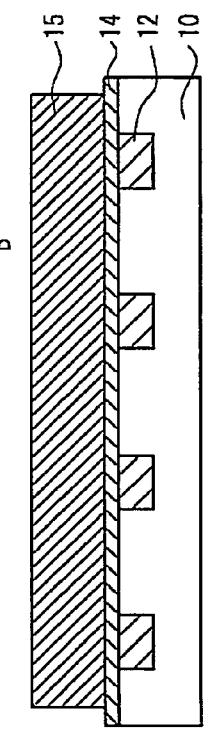
FIG. 5B is a cross-sectional view of the flash memory, taken along the line A-A of FIG. 5A.

Referring now to FIGS. 5A through 5C, a polycrystalline silicon film 15 (to be the word lines) is formed on the entire surface. This polycrystalline silicon film 15 is formed by CVD or the like, and has a film thickness of 200 nm.

Figure 6C:
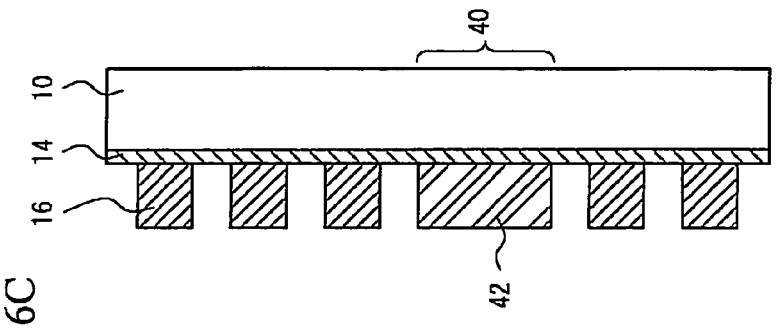
FIG. 6C is a cross-sectional view of the flash memory, taken along the line B-B of FIG. 6A.
Figure 6A:
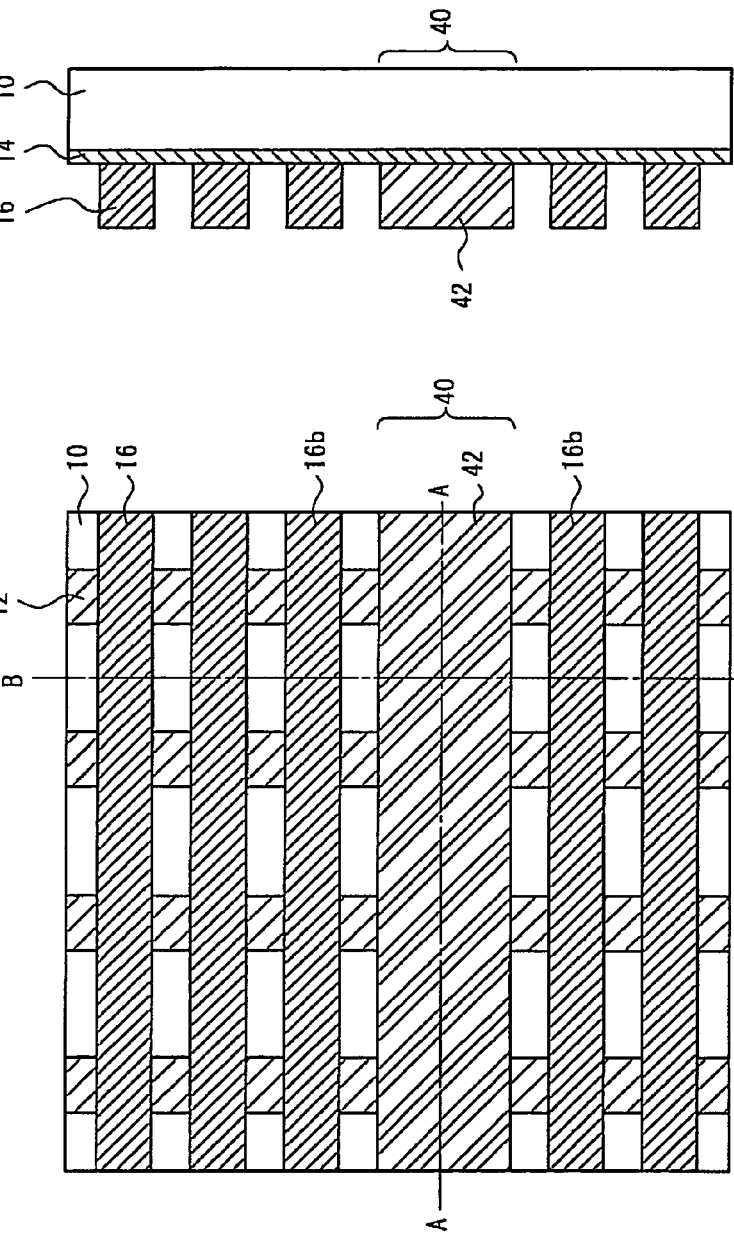
FIG. 6A is a top view illustrating a third procedure for manufacturing the flash memory in accordance with the first embodiment.
Figure 6B:
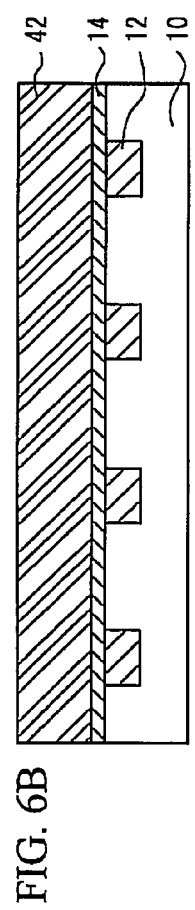
FIG. 6B is a cross-sectional view of the flash memory, taken along the line A-A of FIG. 6A.

Referring now to FIGS. 6A through 6C, photoresist (not shown) is applied onto the polycrystalline silicon film 15, and openings are formed in predetermined regions by an exposure technique. The polycrystalline silicon film 15 is removed by etching, so as to form word lines 16 and a layer 42 that is to be dummy layers. The layer 42 to be dummy layers is formed in a bit-line contact region 40, and extends in the longitudinal direction of the word lines 16. Here, the width of each word line 16 is 140 nm, each word line interval is 80 nm, the width of the layer 42 to be dummy layers is 430 nm, and the distance between the layer 42 to be dummy layers and each neighboring word line 16b is 80 nm, for example.

As described above, the distance between the layer 42 to be dummy layers and each neighboring word line 16b can be made substantially the same as the interval between each two word lines 16. Accordingly, when the photoresist is exposed so as to form the word lines 16 and the layer 42 to be dummy layers, patterns at the same intervals as the intervals among the word lines 16 exist on the outsides of both word lines 16b neighboring the layer 42 to be dummy layers. With this arrangement, a difference in width between the word lines 16b neighboring the bit-line contact region due to a proximity effect can be reduced. The distance between the layer 42 to be dummy layers and each word lines 16b is almost the same as the interval between each two word lines 16 in such a manner that the variation in the widths of the word lines 16 due to a proximity effect does not cause a variation in the electric characteristics of the memory cells.

Referring now to FIGS. 7A through 7C, conventional exposure and etching are performed to etch the layer 42, so as to form a dummy layer 44 between each two bit lines 12 in the bit-line contact region 40.

Figure 8C:
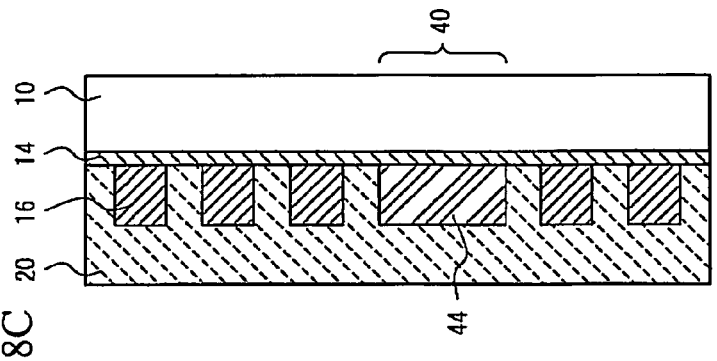
FIG. 8C is a cross-sectional view of the flash memory, taken along the line B-B of FIG. 8A.
Figure 8A:
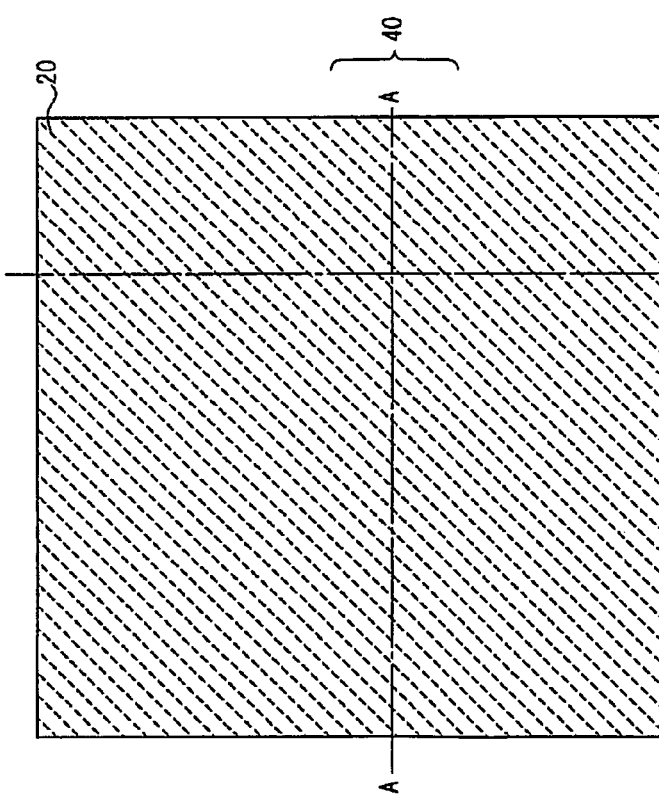
FIG. 8A is a top view illustrating a fifth procedure for manufacturing the flash memory in accordance with the first embodiment.
Figure 8B:
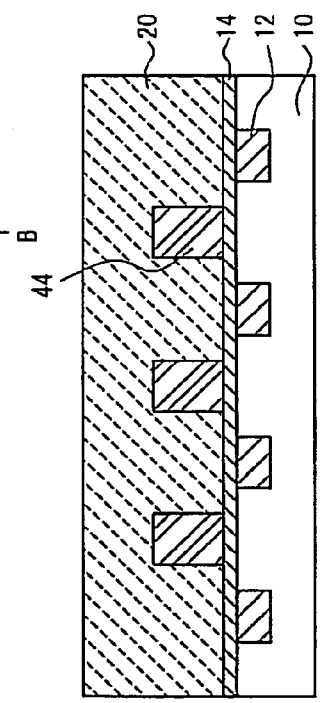
FIG. 8B is a cross-sectional view of the flash memory, taken along the line A-A of FIG. 8A.

Referring now to FIGS. 8A through 8C, a silicon nitride film 20 is formed by CVD, to cover the word lines 16 and the dummy layers 44. The film thickness of the silicon nitride film 20 may be 60 nm, for example. After the formation of a silicon oxide film, a silicon nitride film may be formed so as to reinforce the top oxide film etched at the time of the formation of the word lines 16 and the layer 42 to be dummy layers, as well as to reduce the stress applied on the top oxide film.

Figure 9C:
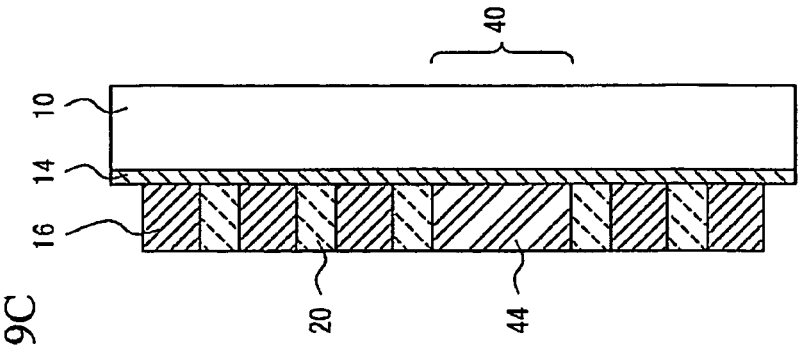
FIG. 9C is a cross-sectional view of the flash memory, taken along the line B-B of FIG. 9A.
Figure 9A:
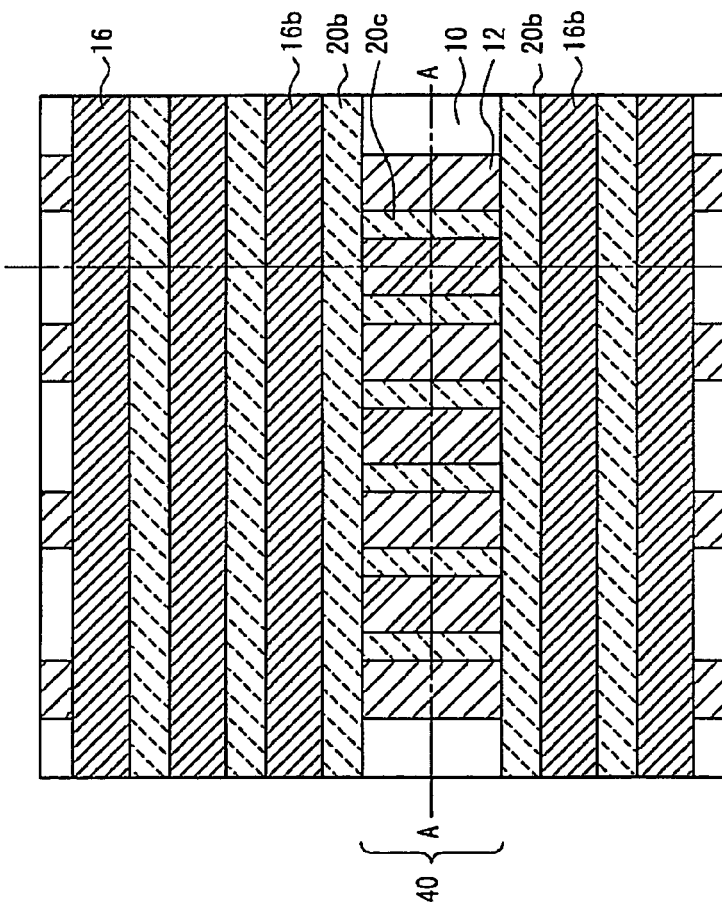
FIG. 9A is a top view illustrating a sixth procedure for manufacturing the flash memory in accordance with the first embodiment.
Figure 9B:
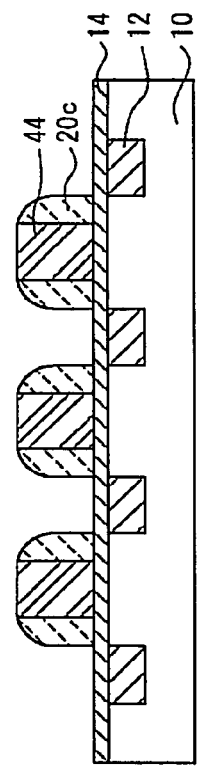
FIG. 9B is a cross-sectional view of the flash memory, taken along the line A-A of FIG. 9A.

Referring now to FIGS. 9A through 9C, etching is performed on the entire surface of the silicon nitride film 20. By doing so, a sidewall layer 20 is formed between each two word lines 16, a sidewall layer 20b is formed between each dummy layer 44 and each word line 16b, and a sidewall layer 20c is formed with a silicon nitride film on either bit-line side of each dummy layer 44. Here, the width of each sidewall layer 20c may be 60 nm, for example. The width and the shape of each sidewall layer 20b formed between the dummy layers 44 and the word lines 16b is almost the same as the width and the shape of each sidewall layer 20 between the word lines 16. Accordingly, the stress caused by the sidewall layers 20b formed between the dummy layers 44 and the word lines 16b is substantially the same as the stress with the sidewall layers 20 between the word lines 16. In this manner, the widths and the shapes of the sidewall layers 20 can be prevented from varying.

In the regions between the dummy layers 44 in the first embodiment, the sidewall layers 20b at the side portions of the word lines 16b neighboring the bit-line contact region 40 each have almost the same width and shape as those of the prior art. Accordingly, the stress caused by the sidewall layers 20b in this region is different from the stress caused by the sidewall layers 20 between the word lines 16. However, the channels of the memory cells are adjacent to the dummy layers 44. In this structure, the stress caused by the sidewall layers 20b formed between the dummy layers 44 and the word lines 16b has more dominant influence on the electric characteristics of the memory cells. Thus, the variation in the electric characteristics of the memory cells in the first embodiment can be made smaller than in the prior art.

Referring now to FIGS. 10A through 10C, a silicon oxide film is formed as an interlayer insulating film 30 over the word lines 16, the dummy layers 44, the sidewall layers 20, and the ONO film 14, by TEOS or the like. Contact holes 32 connecting to the bit lines 12 in the bit-line contact region 40 are formed in the interlayer insulating film 30 and the ONO film 14. Each of the contact holes 32 is filled with a plug metal such as tungsten (W). On the interlayer insulating film 30, wiring layers 34 that extend in the longitudinal direction of the bit lines 12 and connect to the bit lines 12 via the contact holes 32 are formed with aluminum (Al) films or the likes. A silicon oxide film is then formed as a protection film 36 on the wiring layers 34 and the interlayer insulating film 30. Thus, the flash memory in accordance with the first embodiment is completed.

Figure 11A:
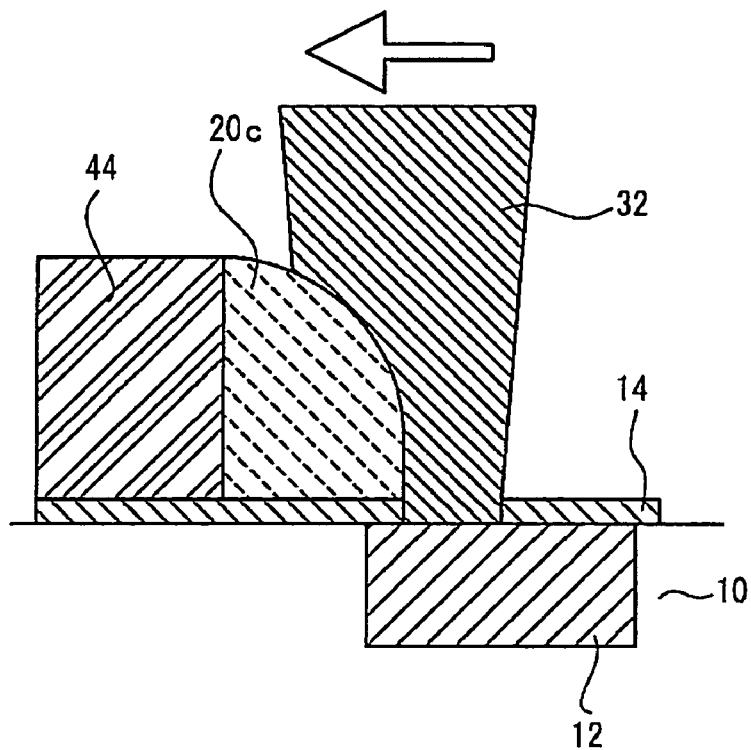
FIGS. 11A and 11B are cross-sectional views showing a contact hole and its surroundings in the flash memory in accordance with the first embodiment.
Figure 11B:
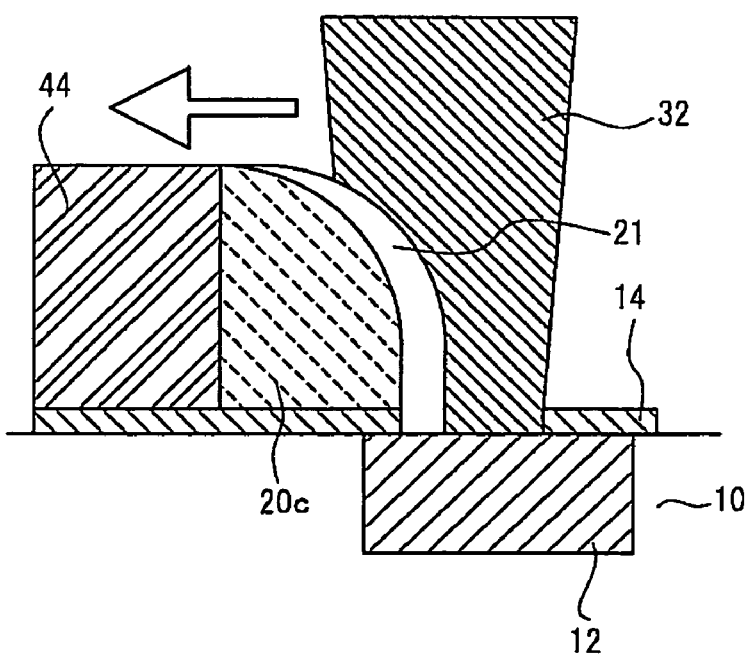

FIGS. 11A and 11B show one of the contact holes 32 shown in FIG. 10B, and the surroundings of the contact hole 32. The same components as those described above are denoted by the same reference numerals as those shown in the previous drawings, and explanation of them is omitted herein. As shown in FIG. 11A, the contact hole 32 might move to the left at the time of exposure. The sidewall layer 20c formed with the silicon nitride film 20 is provided on the semiconductor substrate 10 and is located beside the bit line 12. Selective etching is performed on the interlayer insulating film 30 in relation to the sidewall layer 20c, so as to prevent the contact hole 32 from coming into contact with the semiconductor substrate 10. By doing so, current leakage between the bit line 12 and the semiconductor substrate 10 can be restrained. As shown in FIG. 11B, the sidewall layer 20c may overlap the bit line 12 (as indicated by reference numeral 21). With this arrangement, even if the dummy layer 44 is formed in a position deviated to the left, the sidewall layer 20c can remain on the semiconductor substrate 10. In this manner, the contact hole 32 can be prevented from coming into contact with the semiconductor substrate 10. Thus, the current leakage between the bit line 12 and the semiconductor substrate 10 can be reduced.

The flash memory in accordance with the first embodiment includes the bit lines 12 provided in the semiconductor substrate 10, the ONO film 14 formed on the semiconductor substrate 10, the word lines 16 that are formed on the ONO film 14 and extend in the width direction of the bit lines 12, and the dummy layers 44 that extend in the width direction of the bit lines 12 and are provided in the bit-line contact region 40 having the contact holes formed to connect the bit lines 12 with the wiring layers 34. Since the dummy layers 44 are provided on the bit-line contact region sides of the word lines 16b neighboring the bit-line contact region 40, the proximity effect at the time of the formation of the word lines 16 can be reduced, and variations in the widths of the word lines 16 can be restrained. Also, in the case where the sidewall layers 20 are provided as in the first embodiment, the sidewall layers 20b each having the same width and the same shape as each of the sidewall layers 20 between the word lines 16 can be formed between the word lines 16b and the dummy layers 44. With this arrangement, variations in widths and shapes of the sidewall layers 20 can be restrained. Also, in the case where the contact holes 32 are formed in positions deviating from the bit lines 12, current leakage between the bit lines 12 and the semiconductor substrate 10 can be restrained with the sidewalls 20c.

The dummy layers 44 are formed from the polycrystalline silicon film 15, like the word lines 16, and the film thickness of each of the dummy layers 44 is not purposefully changed. In other words, the film thickness of each of the dummy layers 44 is substantially the same as the film thickness of each of the word lines 16. Accordingly, the variation in the widths of the word lines 16 can be made even smaller. In the case where the sidewall layers 20 are formed as in the first embodiment, variations in the widths and the shapes of the sidewall layers 20b can be restrained.

The distance between each of the dummy layers 44 and each of the neighboring word lines 16b is substantially the same as the distance between each two word lines 16. With this arrangement, the proximity effect at the time of the formation of the word lines 16 can be further reduced. Accordingly, the variation in the widths of the word lines 16 can be made even smaller. In the case where the sidewall layers 20c are formed as in the first embodiment, variations in the widths and shapes of the sidewall layers 20 can be made even smaller.

Furthermore, the dummy layers 44 are formed on the semiconductor substrate 10 and are located between the bit lines 12. With this arrangement, the contact holes 32 connecting to the bit lines 12 can be formed. In the case where the sidewall layers 20 are formed as in the first embodiment, current leakage between the bit lines 12 and the semiconductor substrate 10 can be restrained by virtue of the sidewall layers 20c even if the contact holes 32 are formed in positions deviating from the bit lines 12.

Further, the sidewall layers 20 are provided on both sides of each of the word lines 16 and the dummy layers 44. With this arrangement, the stress caused by the sidewall layers 20b formed between the dummy layers 44 and the word lines 16b can be made almost equal to the stress caused by the sidewall layers 20 between the word lines 16. Also, even if the contact holes 32 are formed in positions deviating from the bit lines 12, current leakage between the bit lines 12 and the semiconductor substrate 10 can be restrained by virtue of the sidewall layers 20c.

Furthermore, the sidewall layers 20c overlap the bit lines 12. With this arrangement, current leakage between the bit lines 12 and the semiconductor substrate 10 can be restrained even if the contact holes 32 are formed in positions deviating from the bit lines 12.

The method of manufacturing the flash memory in accordance with the first embodiment includes the steps of: forming the bit lines 12 in the semiconductor substrate 10; forming the ONO film 14 on the semiconductor substrate 10; forming the word lines 16 on the ONO film 14, with the word lines 16 extending in the width direction of the bit lines 12; and forming the dummy layers 44 on the ONO film 14 in the bit-line contact region 40 having the contact holes 32 to be formed to connect the bit lines 12 with the wiring layers 34, with the dummy layers 44 extending in the width direction of the bit lines 12. By this method, the variation in the widths of the word lines 16 can be made smaller. In the case where the sidewall layers 20 are formed as in the first embodiment, variations in the widths and the shapes of the sidewall layers 20 can be restrained. Also, current leakage between the bit lines 12 and the semiconductor substrate 10 can be restrained.

In the manufacturing method, the step of forming the dummy layers 44 includes the step of forming the word lines 16. Accordingly, the number of steps required for forming the word lines 16 and the dummy layers 44 can be reduced.

Further, the step of forming the dummy layers 44 includes the steps of forming the layer 42 to be the dummy layers 44 in the bit-line contact region 40 at the same time as the step of forming the word lines 16, and removing the layer 42 to be the dummy layers 44 from the bit lines 12, with the layer 42 extending in the longitudinal direction of the word lines 16. Since the layer 42 to be the dummy layers 44 is formed along the neighboring word lines 16b when the word lines 12 are formed, the proximity effect at the time of the formation of the word lines 16 can be further reduced. Thus, the variation in the widths of the word lines 16 can be made even smaller.

The manufacturing method further includes the step of forming the sidewall layers 20 on both sides of each of the word lines 16 and the dummy layers 44. Accordingly, the stress caused by the sidewall layers 20b formed between the dummy layers 44 and the word lines 16b is made substantially the same as the stress caused by the sidewalls 20 between the word lines 16. Also, current leakage between the bit lines 12 and the semiconductor substrate 10 can be restrained.

Second Embodiment

Referring now to FIGS. 12A through 12C, a method of manufacturing a flash memory in accordance with a second embodiment of the present invention is described. In FIG. 12A, the ONO film 14 is not shown. The same components as those of the first embodiment are denoted by the same reference numerals as those in the first embodiment, and explanation of them is omitted herein.

The same manufacturing procedures as those of the first embodiment shown in FIGS. 4A through 5C are carried out to form the polycrystalline silicon film 15 on the entire surface. As shown in FIGS. 12A through 12C, photoresist (not shown) is then applied onto the polycrystalline silicon film 15, and openings are formed in predetermined regions by an exposure technique. The polycrystalline silicon film 15 is removed by an etching technique, so as to form the word lines 16 and the dummy layers 44. The same manufacturing procedures as those of the first embodiment shown in FIGS. 8A through 10C are then carried out to complete the flash memory in accordance with the second embodiment.

In the second embodiment, the layer 42 to be dummy layers formed in the first embodiment is not formed, and the dummy layers 44 are formed from the polycrystalline film 15. Accordingly, the number of manufacturing procedures can be reduced. However, when the word lines 16 are formed, the decrease in the proximity effect is not as large as in the first embodiment, because the dummy layers 44 are partially located on the bit-line contact region sides of the word lines 16b neighboring the bit-line contact region 40. As a result, the variation in the widths of the word lines 16 in the second embodiment is wider than in the first embodiment. Therefore, the first embodiment 1 should be employed in a case where emphasis is put on the decrease in the proximity effect, and the second embodiment should be employed in a case where the number of manufacturing procedures is to be reduced.

Third Embodiment

Referring now to FIGS. 13A through 15C, a method of manufacturing a flash memory in accordance with a third embodiment of the present invention is described. In FIGS. 13A, 14A, and 15A, the ONO film 14, the interlayer insulating film 30, the wiring layers 34, and the protection film 36 are not shown. Also, the same components as those of the first embodiment are denoted by the same reference numerals as those in the first embodiment, and explanation of them is omitted herein.

First, the same procedures as those of the first embodiment shown in FIGS. 4A through 6C are carried out to form the word lines 16 and the layer 42 to be a dummy layer in the bit-line contact region 40. As in the first embodiment, the distance between the layer 42 to be a dummy layer and each neighboring word lines 16b is substantially the same as the distance between each two word lines 16. Accordingly, the variation in the widths of the word lines 16 can be made smaller, as in the first embodiment. As shown in FIGS. 13A through 13C, by a conventional exposure technique and an etching technique, openings of 180 nm in diameter, for example, are formed in the regions in which the contact holes 32 are to be formed in the layer 42 to be a dummy layer. Thus, a dummy layer 46 is formed.

Figure 14C:
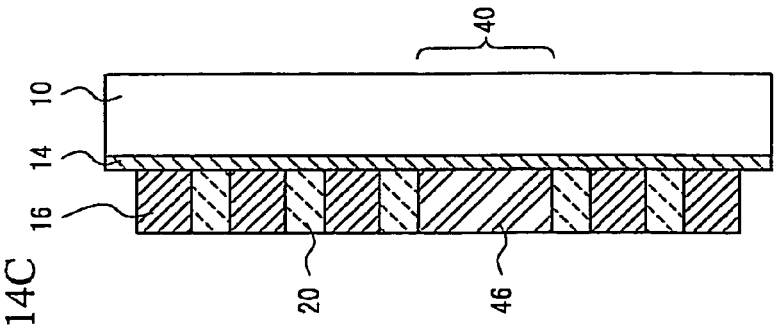
FIG. 14C is a cross-sectional view of the flash memory, taken along the line B-B of FIG. 14A.
Figure 14A:
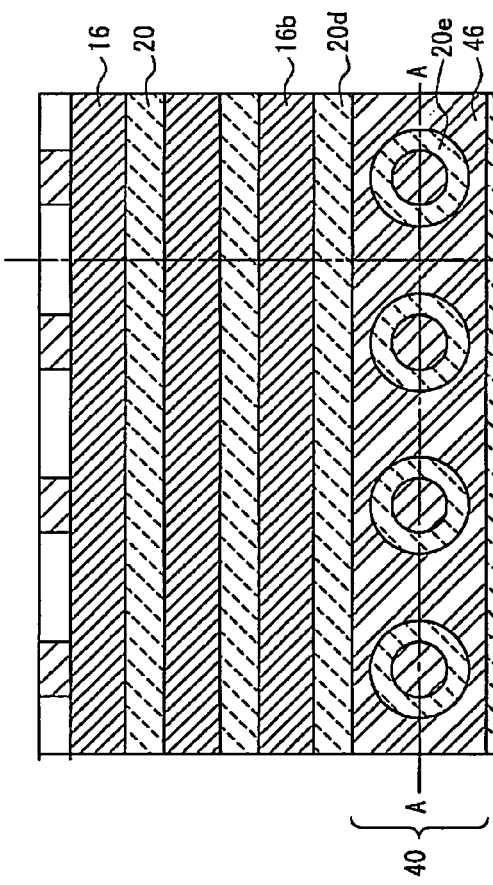
FIG. 14A is a top view illustrating another procedure for manufacturing the flash memory in accordance with the third embodiment.
Figure 14B:
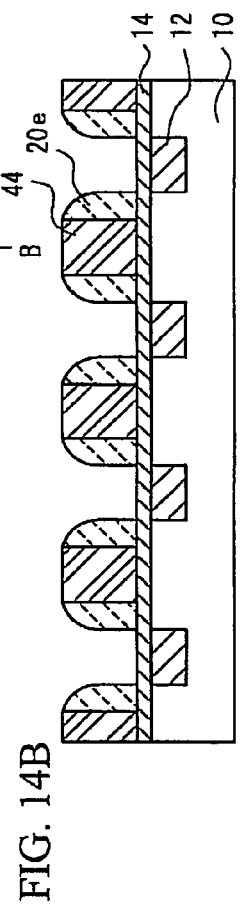
FIG. 14B is a cross-sectional view of the flash memory, taken along the line A-A of FIG. 14A.

Referring now to FIGS. 14A through 14C, a silicon nitride film 20 is formed by CVD, so as to cover the word lines 16 and the dummy layer 46. Etching is then performed on the entire surface of the silicon nitride film 20, so as to form the sidewall layers 20 between the word lines 16, sidewall layers 20d between the dummy layer 46 and the word lines 16b, and sidewall layers 20e made of the silicon nitride film in the openings in the dummy layer 46. The width of each of the sidewall layers 20e may be 60 nm, for example. Here, the size of each of the openings and the width of each of the sidewall layers 20e should preferably be determined so that openings large enough to form the contact holes 32 remain in the sidewall layers 20e formed in the openings in the dummy layer 46.

Since the dummy layer 46 extends in the longitudinal direction of the word lines 16, the width and the shape of each of the sidewall layers 20d formed between the dummy layer 46 and the word lines 16b are almost the same, in the longitudinal direction of the word lines 16, as the width and the shape of each of the sidewall layers 20 between the word lines 16. Accordingly, the stress caused by the sidewall layers 20d formed between the dummy layer 46 and the word lines 16b is almost the same as the stress caused by the sidewall layers 20 between the word lines 16. In this manner, the variation in the electric characteristics of the memory cells can be made smaller than in the first embodiment and the second embodiment in which the dummy layers 44 are separated from one another in the longitudinal direction of the word lines 16.

Referring now to FIGS. 15A through 15C, the interlayer insulating film 30 is formed over the word lines 16, the dummy layer 46, and the sidewall layers 20, as in the first embodiment shown in FIGS. 10A through 10C. The contact holes 32 penetrating through the center regions of the openings in the dummy layer 46 are formed in the interlayer insulating film 30. The wiring layers 34 and the protection film 36 are then formed, as in the first embodiment. Thus, the flash memory in accordance with the third embodiment is completed.

In the third embodiment, the contact holes 32 are surrounded by the sidewall layers 20c. Accordingly, if the contact holes 32 are formed in positions deviating in the longitudinal direction of the word lines 16, current leakage between the bit lines 12 and the semiconductor substrate 10 can be restrained.

In the third embodiment, the dummy layer 46 is formed continuously in the longitudinal direction of the word lines 16, and has the openings containing the contact holes 32. With this arrangement, the variation in the word line widths due to the proximity effect at the time of the formation of the word lines 16 can be made smaller. Also, the variations in the widths and the shapes of the sidewall layers 20 can be made smaller when the sidewall layers 20 are formed, and current leakage between the bit lines 12 and the semiconductor substrate 10 can be restrained.

In the first through third embodiments, the film thickness of each of the word lines 16 is substantially the same as the film thickness of each of the dummy layers 44 and 46. However, the widths of the sidewall layers 20c and 20e formed at the side portions of the dummy layers 44 and 46 may be varied by varying the film thicknesses of the dummy layers 44 and 46, for example. Also, the word lines 16 and the dummy layers 44 and 46 may be made of any metal that can function as word lines, though they are formed from a polycrystalline silicon film in the first through third embodiments. Further, the sidewall layers 20 may be made from any insulating film, though they are formed from a silicon nitride film in the first through third embodiments. However, the sidewall layers 20 should preferably exhibit etching selectivity with the interlayer insulating film 30.

Embodiments of the present claimed subject matter generally relates to semiconductor devices. More particularly, embodiments allow semiconductor devices to function with increased efficiency. In one implementation, the claimed subject matter is applicable to flash memory and devices that utilize flash memory. Flash memory is a form of non-volatile memory that can be electrically erased and reprogrammed. As such, flash memory, in general, is a type of electrically erasable programmable read only memory (EEPROM).

Like Electrically Erasable Programmable Read Only Memory (EEPROM), flash memory is nonvolatile and thus can maintain its contents even without power. However, flash memory is not standard EEPROM. Standard EEPROMs are differentiated from flash memory because they can be erased and reprogrammed on an individual byte or word basis while flash memory can be programmed on a byte or word basis, but is generally erased on a block basis. Although standard EEPROMs may appear to be more versatile, their functionality requires two transistors to hold one bit of data. In contrast, flash memory requires only one transistor to hold one bit of data, which results in a lower cost per bit. As flash memory costs far less than EEPROM, it has become the dominant technology wherever a significant amount of non-volatile, solid-state storage is needed.

Examplary applications of flash memory include digital audio players, digital cameras, digital video recorders, and mobile phones. Flash memory is also used in USB flash drives, which are used for general storage and transfer of data between computers. Also, flash memory is gaining popularity in the gaming market, where low-cost fast-loading memory in the order of a few hundred megabytes is required, such as in game cartridges. Additionally, flash memory is applicable to cellular handsets, smartphones, personal digital assistants, set-top boxes, digital video recorders, networking and telecommunication equipments, printers, computer peripherals, automotive nagivation devices, and gaming systems.

As flash memory is a type of non-volatile memory, it does not need power to maintain the information stored in the chip. In addition, flash memory offers fast read access times and better shock resistance than traditional hard disks. These characteristics explain the popularity of flash memory for applications such as storage on battery-powered devices (e.g., cellular phones, mobile phones, IP phones, wireless phones.).

Flash memory stores information in an array of floating gate transistors, called "cells", each of which traditionally stores one bit of information. However, newer flash memory devices, such as MirrorBit Flash Technology from Spansion Inc., can store more than 1 bit per cell. The MirrorBit cell doubles the intrinsic density of a Flash memory array by storing two physically distinct bits on opposite sides of a memory cell. Each bit serves as a binary bit of data (e.g., either 1 or 0) that is mapped directly to the memory array. Reading or programming one side of a memory cell occurs independently of whatever data is stored on the opposite side of the cell.

With regards to wireless markets, flash memory that utilizes MirrorBit technology has several key advantages. For example, flash memory that utilizes MirrorBit technology are capable of burst-mode access as fast as 80 MHz, page access times as fast as 25 ns, simultaneous read-write operation for combined code and data storage, and low standby power (e.g., 1 µA).

Figure 16:
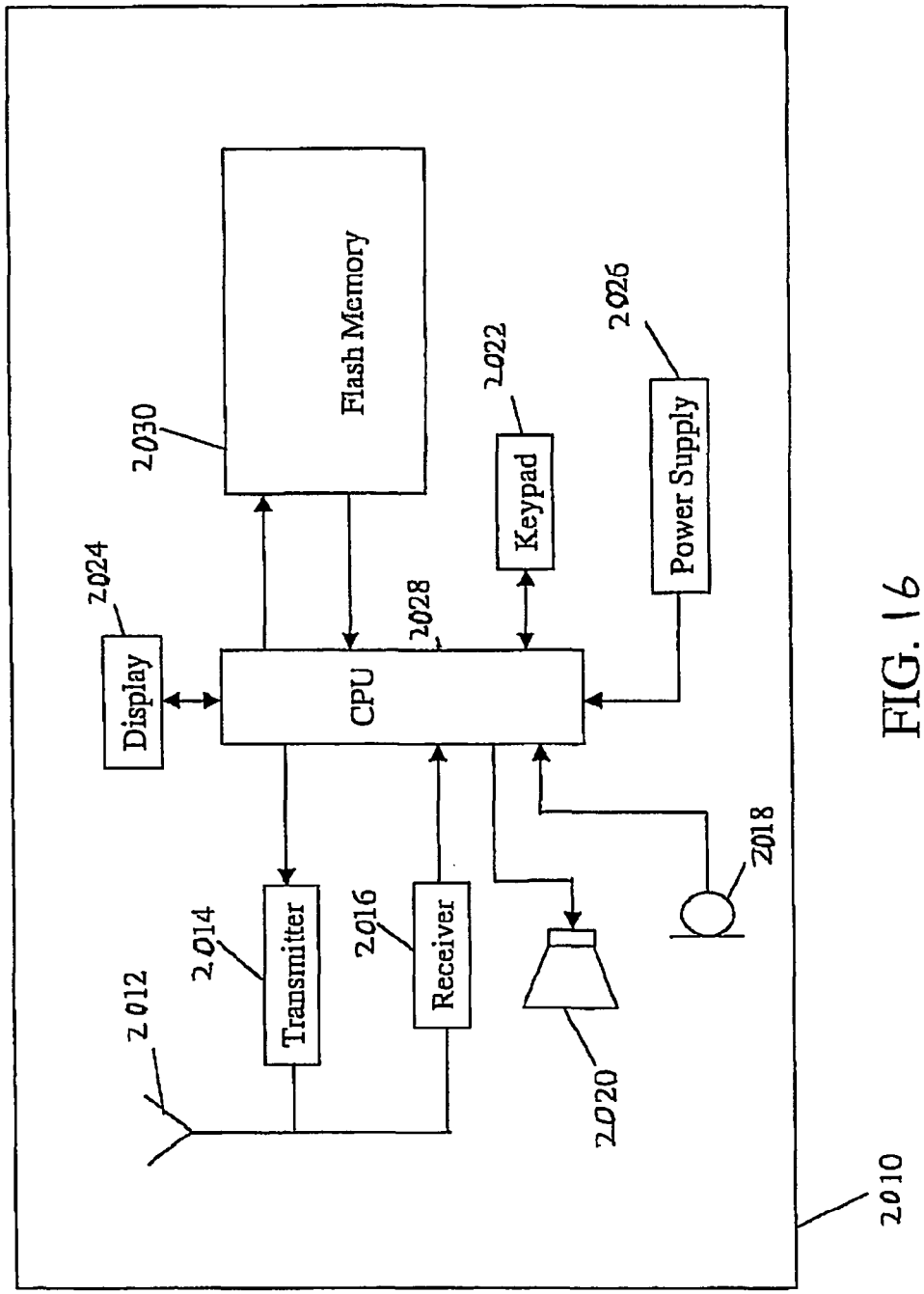
FIG. 16 illustrates a block diagram of a conventional portable phone, upon which embodiments can be implemented.

FIG. 16 shows a block diagram of a conventional portable telephone 2010 (a.k.a. cell phone, cellular phone, mobile phone, internet protocol phone, wireless phone, etc.), upon which embodiments can be implemented. The cell phone 2010 includes an antenna 2012 coupled to a transmitter 2014 a receiver 2016, as well as, a microphone 2018, speaker 2020, keypad 2022, and display 2024. The cell phone 2010 also includes a power supply 2026 and a central processing unit (CPU) 2028, which may be an embedded controller, conventional microprocessor, or the like. In addition, the cell phone 2010 includes integrated, flash memory 2030. Flash memory 2030 includes bit lines that are provided in a semiconductor substrate; an ONO film that is provided on the semiconductor substrate; word lines that are provided on the ONO film and extend in a width direction of the bit lines; and a dummy layer that extends in the width direction of the bit lines and is provided in a bit-line contact region having contact holes formed to connect the bit lines with wiring layers. Embodiments can retrain a variation in the widths of word lines, restrain variations in the widths and shapes of the sidewall layers, and retrain current leakage between the bit lines and the semiconductor substrate. As a result, among other things, embodiments facilitate the production of higher quality flash memory. This increase in flash memory quality translates into performance improvements in various devices, such as personal digital assistants, set-top boxes, digital video recorders, networking and telecommunication equipments, printers, computer peripherals, automotive navigation devices, gaming systems, mobile phones, cellular phones, internet protocol phones, and/or wireless phones.

Flash memory comes in two primary varieties, NOR-type flash and NAND-type flash. While the general memory storage transistor is the same for all flash memory, it is the interconnection of the memory cells that differentiates the designs. In a conventional NOR-type flash memory, the memory cell transistors are connected to the bit lines in a parallel configuration, while in a conventional NAND-type flash memory, the memory cell transistors are connected to the bit lines in series. For this reason, NOR-type flash is sometimes referred to as "parallel flash" and NAND-type flash is referred to as "serial flash."

Traditionally, portable phone (e.g., cell phone) CPUs have needed only a small amount of integrated NOR-type flash memory to operate. However, as portable phones (e.g., cell phone) have become more complex, offering more features and more services (e.g., voice service, text messaging, camera, ring tones, email, multimedia, mobile TV, MP3, location, productivity software, multiplayer games, calendar, and maps.), flash memory requirements have steadily increased. Thus, a more efficient flash memory will render a portable phone more competitive in the telecommunications market.

Also, as mentioned above, flash memory is applicable to a variety of devices other than portable phones. For instance, flash memory can be utilized in personal digital assistants, set-top boxes, digital video recorders, networking and telecommunication equipments, printers, computer peripherals, automotive navigation devices, and gaming systems.

Figure 17:
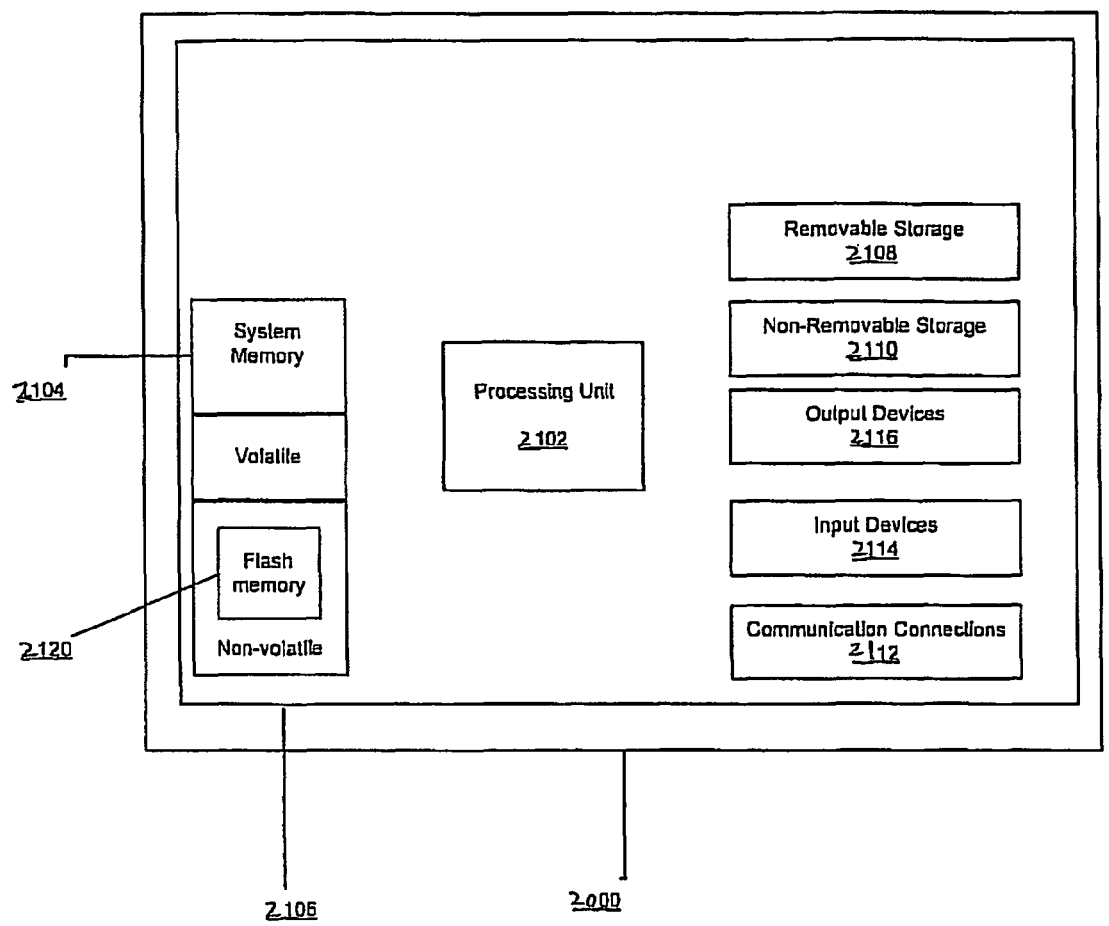
FIG. 17 illustrates a block diagram of a computing device, upon which embodiments of the present claimed subject matter can be implemented.

FIG. 17 illustrates a block diagram of a computing device 2100, upon which embodiments of the present claimed subject matter can be implemented. Although computing device 2100 is shown and described in FIG. 17 as having certain numbers and types of elements, the embodiments are not necessarily limited to the exemplary implementation. That is, computing device 2100 can include elements other than those shown, and can include more than one of the elements that are shown. For example, computing device 2100 can include a greater number of processing units than the one (processing unit 2102) shown. Similarly, in another example, computing device 2100 can include additional components not shown in FIG. 17.

Also, it is important to note that the computing device 2100 can be a variety of things. For example, computing device 2100 can be but are not limited to a personal desktop computer, a portable notebook computer, a personal digital assistant (PDA), and a gaming system. Flash memory is especially useful with small-form-factor computing devices such as PDAs and portable gaming devices. Flash memory offers several advantages. In one example, flash memory is able to offer fast read access times while at the same time being able to withstand shocks and bumps better than standard hard disks. This is important as small computing devices are often moved around and encounters frequent physical impacts. Also, flash memory is more able than other types of memory to withstand intense physical pressure and/or heat. And thus, portable computing devices are able to be used in a greater range of environmental variables.

In its most basic configuration, computing device 2100 typically includes at least one processing unit 2102 and memory 2104. Depending on the exact configuration and type of computing device, memory 2104 may be volatile (such as RAM), non-volatile (such as ROM, flash memory, etc.) or some combination of the two. This most basic configuration of computing device 2100 is illustrated in FIG. 17 by line

2106. Additionally, device 2100 may also have additional features/functionality. For example, device 2100 may also include additional storage (removable and/or non-removable) including, but not limited to, magnetic or optical disks or tape. In one example, in the context of a gaming system, the removable storage could a game cartridge receiving component utilized to receive different game cartridges. In another example, in the context of a Digital Video Disc (DVD) recorder, the removable storage is a DVD receiving component utilized to receive and read DVDs. Such additional storage is illustrated in FIG. 17 by removable storage 2108 and non-removable storage 2110. Computer storage media includes volatile and nonvolatile, removable and non-removable media implemented in any method or technology for storage of information such as computer readable instructions, data structures, program modules or other data. Memory 2104, removable storage 2108 and non-removable storage 2110 are all examples of computer storage media. Computer storage media includes, but is not limited to, RAM, ROM, EEPROM, flash memory 2120 or other memory technology, CD-ROM, digital video disks (DVD) or other optical storage, magnetic cassettes, magnetic tape, magnetic disk storage or other magnetic storage devices, or any other medium which can be used to store the desired information and which can accessed by device 2100. Any such computer storage media may be part of device 2100.

In the present embodiment, the flash memory 2120 comprises: bit lines that are provided in a semiconductor substrate; an ONO film that is provided on the semiconductor substrate; word lines that are provided on the ONO film and extend in a width direction of the bit lines; and a dummy layer that extends in the width direction of the bit lines and is provided in a bit-line contact region having contact holes formed to connect the bit lines with wiring layers. Embodiments can retrain a variation in the widths of word lines, restrain variations in the widths and shapes of the sidewall layers, and retrain current leakage between the bit lines and the semiconductor substrate. As a result, among other things, embodiments facilitate the production of higher quality flash memory. This increase in flash memory quality translates into performance improvements in various devices, such as personal digital assistants, set-top boxes, digital video recorders, networking and telecommunication equipments, printers, computer peripherals, automotive navigation devices, gaming systems, mobile phones, cellular phones, internet protocol phones, and/or wireless phones.

Further, in one embodiment, the flash memory 2120 utilizes mirrorbit technology to allow storing of two physically distinct bits on opposite sides of a memory cell.

Device 2100 may also contain communications connection(s) 2112 that allow the device to communicate with other devices. Communications connection(s) 2112 is an example of communication media. Communication media typically embodies computer readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media. The term computer readable media as used herein includes both storage media and communication media.

Device 2100 may also have input device(s) 2114 such as keyboard, mouse, pen, voice input device, game input device (e.g., a joy stick, a game control pad, and/or other types of game input device), touch input device, etc. Output device(s) 2116 such as a display (e.g., a computer monitor and/or a projection system), speakers, printer, network peripherals, etc., may also be included. All these devices are well know in the art and need not be discussed at length here.

Aside from mobile phones and portable computing devices, flash memory is also widely used in portable multimedia devices, such as portable music players. As users would desire a portable multimedia device to have as large a storage capacity as possible, an increase in memory density would be advantageous. Also, users would also benefit from reduced memory read time.

Figure 18:
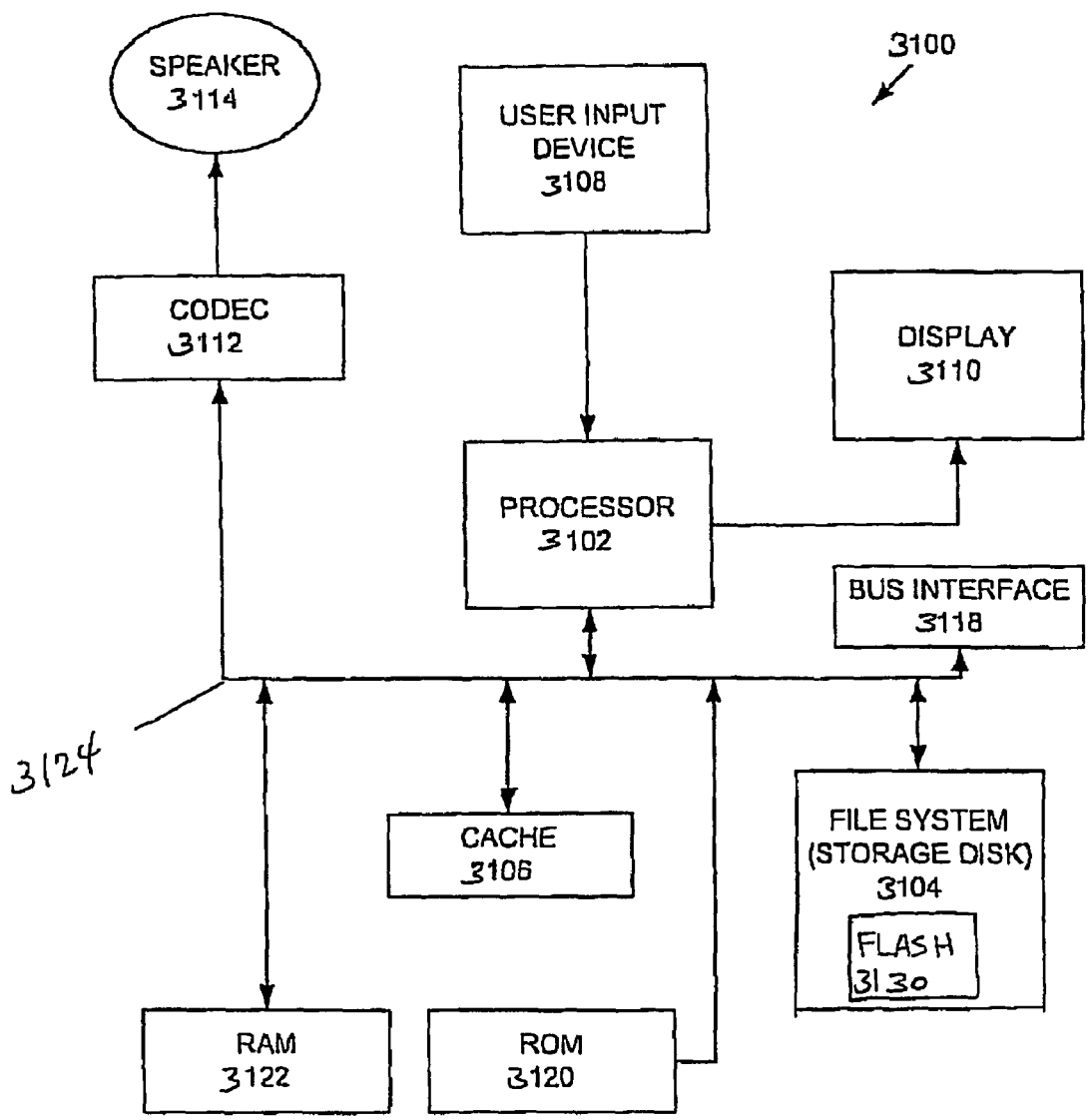
FIG. 18 illustrates an exemplary portable multimedia device, or media player, in accordance with an embodiment of the invention.

FIG. 18 shows an exemplary portable multimedia device, or media player, 3100 in accordance with an embodiment of the invention. The media player 3100 includes a processor 3102 that pertains to a microprocessor or controller for controlling the overall operation of the media player 3100. The media player 3100 stores media data pertaining to media assets in a file system 3104 and a cache 3106. The file system 3104 is, typically, a storage disk or a plurality of disks. The file system 3104 typically provides high capacity storage capability for the media player 3100. Also, file system 3104 includes flash memory 3130. In the present embodiment, the flash memory 3130 comprises: bit lines that are provided in a semiconductor substrate; an ONO film that is provided on the semiconductor substrate; word lines that are provided on the ONO film and extend in a width direction of the bit lines; and a dummy layer that extends in the width direction of the bit lines and is provided in a bit-line contact region having contact holes formed to connect the bit lines with wiring layers. Embodiments can retrain a variation in the widths of word lines, restrain variations in the widths and shapes of the sidewall layers, and retrain current leakage between the bit lines and the semiconductor substrate. As a result, among other things, embodiments facilitate the production of higher quality flash memory. This increase in flash memory quality translates into performance improvements in various devices, such as personal digital assistants, set-top boxes, digital video recorders, networking and telecommunication equipments, printers, computer peripherals, automotive navigation devices, gaming systems, mobile phones, cellular phones, internet protocol phones, and/or wireless phones. However, since the access time to the file system 3104 is relatively slow, the media player 3100 can also include a cache 3106. The cache 3106 is, for example, Random-Access Memory (RAM) provided by semiconductor memory. The relative access time to the cache 3106 is substantially shorter than for the file system 3104. However, the cache 3106 does not have the large storage capacity of the file system 3104. Further, the file system 3104, when active, consumes more power than does the cache 3106. The power consumption is particularly important when the media player 3100 is a portable media player that is powered by a battery (not shown). The media player 3100 also includes a RAM 3120 and a Read-Only Memory (ROM) 3122. The ROM 3122 can store programs, utilities or processes to be executed in a non-volatile manner. The RAM 3120 provides volatile data storage, such as for the cache 3106.

The media player 3100 also includes a user input device 3108 that allows a user of the media player 3100 to interact with the media player 3100. For example, the user input device 3108 can take a variety of forms, such as a button, keypad, dial, etc. Still further, the media player 3100 includes a display 3110 (screen display) that can be controlled by the processor 3102 to display information to the user. A data bus 3124 can facilitate data transfer between at least the file system 3104, the cache 3106, the processor 3102, and the CODEC 3110. The media player 3100 also includes a bus interface 3116 that couples to a data link 3118. The data link 3118 allows the media player 3100 to couple to a host computer.

In one embodiment, the media player 3100 serves to store a plurality of media assets (e.g., songs) in the file system 3104. When a user desires to have the media player play a particular media item, a list of available media assets is displayed on the display 3110. Then, using the user input device 3108, a user can select one of the available media assets. The processor 3102, upon receiving a selection of a particular media item, supplies the media data (e.g., audio file) for the particular media item to a coder/decoder (CODEC) 3110. The CODEC 3110 then produces analog output signals for a speaker 3114. The speaker 3114 can be a speaker internal to the media player 3100 or external to the media player 3100. For example, headphones or earphones that connect to the media player 3100 would be considered an external speaker.

For example, in a particular embodiment, the available media assets are arranged in a hierarchical manner based upon a selected number and type of groupings appropriate to the available media assets. For example, in the case where the media player 3100 is an MP3 type media player, the available media assets take the form of MP3 files (each of which corresponds to a digitally encoded song or other audio rendition) stored at least in part in the file system 3104. The available media assets (or in this case, songs) can be grouped in any manner deemed appropriate. In one arrangement, the songs can be arranged hierarchically as a list of music genres at a first level, a list of artists associated with each genre at a second level, a list of albums for each artist listed in the second level at a third level, while at a fourth level a list of songs for each album listed in the third level, and so on.

According to a first aspect of the present invention, there is preferably provided a semiconductor device including: bit lines that are provided in a semiconductor substrate; an ONO film that is provided on the semiconductor substrate; word lines that are provided on the ONO film and extend in a width direction of the bit lines; and a dummy layer that extends in the width direction of the bit lines and is provided in a bit-line contact region having contact holes formed to connect the bit lines with wiring layers.

In the above-described semiconductor device, the film thickness of the dummy layer may be substantially the same as the film thickness of each of the word lines. In accordance with the present invention, the variation in the widths of the word lines can be made even smaller.

In the above-described semiconductor device, the distance between the dummy layer and each word line neighboring the dummy layer may be substantially the same as the distance between each two of the word lines. In accordance with the present invention, the variation in the widths of the word lines can be made even smaller.

In the above-described semiconductor device, the dummy layer may be formed on the semiconductor substrate and is located between the bit lines. In accordance with the present invention, contact holes connecting to the bit lines can be formed.

In the above-described semiconductor device, the dummy layer may be continuously formed in a longitudinal direction of the word lines, and has openings to contain the contact holes. In accordance with the present invention, the variation in the widths of the word lines due to the proximity effect at the time of word line formation can be reduced. When the sidewall layers are formed, variations in the widths and shapes of the sidewall layers can be reduced, and current leakage between the bit lines and the semiconductor substrate can be restrained.

In the above-described semiconductor device, sidewall layers may be provided on both sides of each of the word lines and the dummy layer. In accordance with the present invention, variations in the widths and shapes of the sidewall layers can be reduced by the dummy layer. Also, even if the contact holes are formed in positions deviating from the bit lines, current leakage between the bit lines and the semiconductor substrate can be restrained.

In the above-described semiconductor device, the sidewall layers may overlap the bit lines. In accordance with the present invention, current leakage between the bit lines and the semiconductor substrate can be more strictly restrained.

According to a second aspect of the present invention, there is preferably a method of fabricating a semiconductor device, comprising the steps of: forming bit lines in a semiconductor substrate; forming an ONO film on the semiconductor substrate; forming word lines on the ONO film, the word lines extending in a width direction of the bit lines; and forming a dummy layer on the ONO film in a bit-line contact region having contact holes to be formed to connect the bit lines with wiring layers, the dummy layer extending in the width direction of the bit lines.

In the above-described method, the step of forming the dummy layer may include forming the word lines. In accordance with the present invention, the number of steps required for forming the dummy layer can be reduced.

In the above-described method, the step of forming the dummy layer may include forming a layer to be the dummy layer in the bit-line contact region at the same time as the step of forming the word lines, and removing the layer to be the dummy layer from the bit lines, the layer to be the dummy layer extending in a longitudinal direction of the word lines. In accordance with the present invention, the variation in the widths of the word lines can be made even smaller.

The above-described method may further include the step of forming sidewall layers on both sides of each of the word lines and the dummy layer. In accordance with the present invention, variations in the widths and shapes of the sidewall layers can be reduced by the dummy layer. Also, even if the contact holes are formed in positions deviating from the bit lines, current leakage between the bit lines and the semiconductor substrate can be restrained.

As described above, the present invention can provide a semiconductor device that can restrain a variation in the widths of the word lines, restrain variations in the widths and shapes of the sidewall layers, and restrain current leakage between the bit lines and the semiconductor substrate. The present invention can also provide a method of fabricating such a semiconductor device.

Although a few preferred embodiments of the present invention have been shown and described, it would be appreciated by those skilled in the art that changes may be made in these embodiments without departing from the principles and spirit of the invention, the scope of which is defined in the claims and their equivalents.

The invention claimed is:

1. A semiconductor device comprising:
   bit lines that are provided in a semiconductor substrate;
   an ONO film that is provided on the semiconductor substrate;
   word lines that are provided on the ONO film and which extend in a width direction of the bit lines;
   an interlayer insulating (ILI) film that is provided on the word lines;

wiring layers that are provided on the ILI film; and a bit-line contact region that is provided between two adjacent word lines, wherein, in the bit-line contact region, the device further comprises:

contact holes that are provided in the ILI film, the contact holes connecting the bit lines with the wiring layers; and dummy layers that are provided directly on the ONO film, wherein one of the dummy layers is formed between each adjacent pair of the contact holes.

2. The semiconductor device as claimed in claim 1, wherein the film thickness of the dummy layer is substantially the same as the film thickness of each of the word lines.

3. The semiconductor device as claimed in claim 1, wherein the distance between the dummy layer and each word line neighboring the dummy layer is substantially the same as the distance between each two of the word lines.

4. The semiconductor device as claimed in claim 1, wherein the dummy layer is formed on the semiconductor substrate and is located between the bit lines.

5. The semiconductor device as claimed in claim 1, wherein the dummy layer is continuously formed in a longitudinal direction of the word lines, and has openings to contain the contact holes.

6. The semiconductor device as claimed in claim 1, wherein sidewall layers are provided on both sides of each of the word lines and the dummy layer.

7. The semiconductor device as claimed in claim 6, wherein the sidewall layers overlap the bit lines.

8. A wireless communications device, said wireless communications device comprising:

a flash memory comprising:

bit lines that are provided in a semiconductor substrate;

an ONO film that is provided on the semiconductor substrate;

word lines that are provided on the ONO film and which extend in a width direction of the bit lines;

an interlayer insulating (ILI) film that is provided on the word lines;

wiring layers that are provided on the ILI film; and a bit-line contact region that is provided between two adjacent word lines, wherein, in the bit-line contact region, the flash memory further comprises:

contact holes that are provided in the ILI film, the contact holes connecting the bit lines with the wiring layers; and dummy layers that are provided directly on the ONO film, wherein one of the dummy layers is formed between each adjacent pair of the contact holes;

a processor;

a communications component;

a transmitter;

a receiver; and an antenna connected to the transmitter and the receiver.

9. The wireless communications device of claim 8, wherein said flash memory is NAND flash memory.

10. The wireless communications device of claim 8, wherein said flash memory is NOR flash memory.

11. The wireless communications device of claim 8, wherein said flash memory utilizes mirrorbits technology.

12. A computing device comprising:

a processor;

an input component;

an output component;

a memory comprising:

a volatile memory; and a flash memory comprising:

bit lines that are provided in a semiconductor substrate;

an ONO film that is provided on the semiconductor substrate;

word lines that are provided on the ONO film and which extend in a width direction of the bit lines;

an interlayer insulating (ILI) film that is provided on the word lines;

wiring layers that are provided on the ILI film; and a bit-line contact region that is provided between two adjacent word lines, wherein, in the bit-line contact region, the flash memory further comprises:

contact holes that are provided in the ILI film, the contact holes connecting the bit lines with the wiring layers; and dummy layers that are provided directly on the ONO film, wherein one of the dummy layers is formed between each adjacent pair of the contact holes.

13. The computing device of claim 12, wherein said computing device is a personal computer (PC).

14. The computing device of claim 12, wherein said computing device is a gaming system.

15. The computing device of claim 12, wherein said computing device is a gaming system.

16. A portable media player comprising:

a processor;

a cache;

a user input component;

a coder-decoder component;

a memory comprising:

a flash memory comprising:

bit lines that are provided in a semiconductor substrate;

an ONO film that is provided on the semiconductor substrate;

word lines that are provided on the ONO film and which extend in a width direction of the bit lines;

an interlayer insulating (ILI) film that is provided on the word lines;

wiring layers that are provided on the ILI film; and a bit-line contact region that is provided between two adjacent word lines, wherein, in the bit-line contact region, the flash memory further comprises:

contact holes that are provided in the ILI film, the contact holes connecting the bit lines with the wiring layers; and dummy layers that are provided directly on the ONO film, wherein one of the dummy layers is formed between each adjacent pair of the contact holes.

17. The portable media player of claim 16, wherein said portable media player is a portable music player.

18. The portable media player of claim 16, wherein said portable media player is a portable video player.

* * * * *